US011978961B2

(12) United States Patent
Shamblin et al.

(10) Patent No.: US 11,978,961 B2
(45) Date of Patent: *May 7, 2024

(54) MILLIMETER WAVE ANTENNA ARRAY

(71) Applicant: Taoglas Group Holdings Limited, Enniscorthy (IE)

(72) Inventors: Jeffrey Keith Shamblin, San Marcos, CA (US); Vladimir Furlan, Munich (DE); Patrick Carl Frank, Minneapolis, MN (US)

(73) Assignee: Taoglas Group Holdings Limited, Enniscorthy (IE)

( * ) Notice: Subject to any disclaimer, the term of this patent is extended or adjusted under 35 U.S.C. 154(b) by 0 days.

This patent is subject to a terminal disclaimer.

(21) Appl. No.: 17/987,193

(22) Filed: Nov. 15, 2022

(65) Prior Publication Data

US 2023/0178900 A1  Jun. 8, 2023

Related U.S. Application Data

(63) Continuation of application No. 16/903,169, filed on Jun. 16, 2020, now Pat. No. 11,509,065.

(60) Provisional application No. 62/862,516, filed on Jun. 17, 2019.

(51) Int. Cl.
*H01Q 21/06* (2006.01)
*H01Q 1/12* (2006.01)
*H01Q 9/06* (2006.01)
*H01Q 9/16* (2006.01)
*H01Q 21/24* (2006.01)
(Continued)

(52) U.S. Cl.
CPC ............. *H01Q 21/062* (2013.01); *H01Q 1/12* (2013.01); *H01Q 9/065* (2013.01); *H01Q 9/16* (2013.01); *H01Q 21/24* (2013.01); *H04B 7/0617* (2013.01); *H05K 1/0203* (2013.01); *H05K 1/0243* (2013.01); *H05K 2201/10098* (2013.01)

(58) Field of Classification Search
CPC .. H01Q 1/02; H01Q 1/12; H01Q 9/16; H01Q 9/065; H01Q 21/062; H01Q 21/0025; H01Q 21/24; H01Q 21/26; H01Q 21/0087; H04B 7/0617; H05K 1/0203; H05K 1/0243; H05K 1/0209; H05K 1/144; H05K 1/165; H05K 2201/10098; H05K 2201/042; H05K 2201/066; H05K 2201/09618

See application file for complete search history.

(56) References Cited

U.S. PATENT DOCUMENTS 6,359,596 B1  3/2002  Claiborne
9,397,404 B1  7/2016  McDevitt et al.
(Continued)

*Primary Examiner* — Robert Karacsony
(74) *Attorney, Agent, or Firm* — Garson & Gutierrez, PC

(57) ABSTRACT

An antenna array may include a plurality of printed circuit boards (PCBs) oriented in a stacked arrangement, parallel to and spaced apart from one another. Each of the PCBs may include a linear array of antenna elements, which cooperate with the linear arrays of antenna elements on other PCBs to form a two-dimensional array of antenna elements. The PCBs may be supported at one end by a common backplate in a cantilevered manner, with the linear arrays of antenna elements located near the free end of the PCBs. The PCBs may include a thicker portion and a thinner portion, and the thinner portion may include a heat sink or other thermal dissipation structure.

17 Claims, 21 Drawing Sheets

(51) Int. Cl.
*H04B 7/06* (2006.01)
*H05K 1/02* (2006.01)

(56) References Cited

U.S. PATENT DOCUMENTS 11,509,065 B2 * 11/2022 Shamblin ............... H05K 1/144
2022/0069476 A1 * 3/2022 Yoo ....................... H01Q 1/526

* cited by examiner

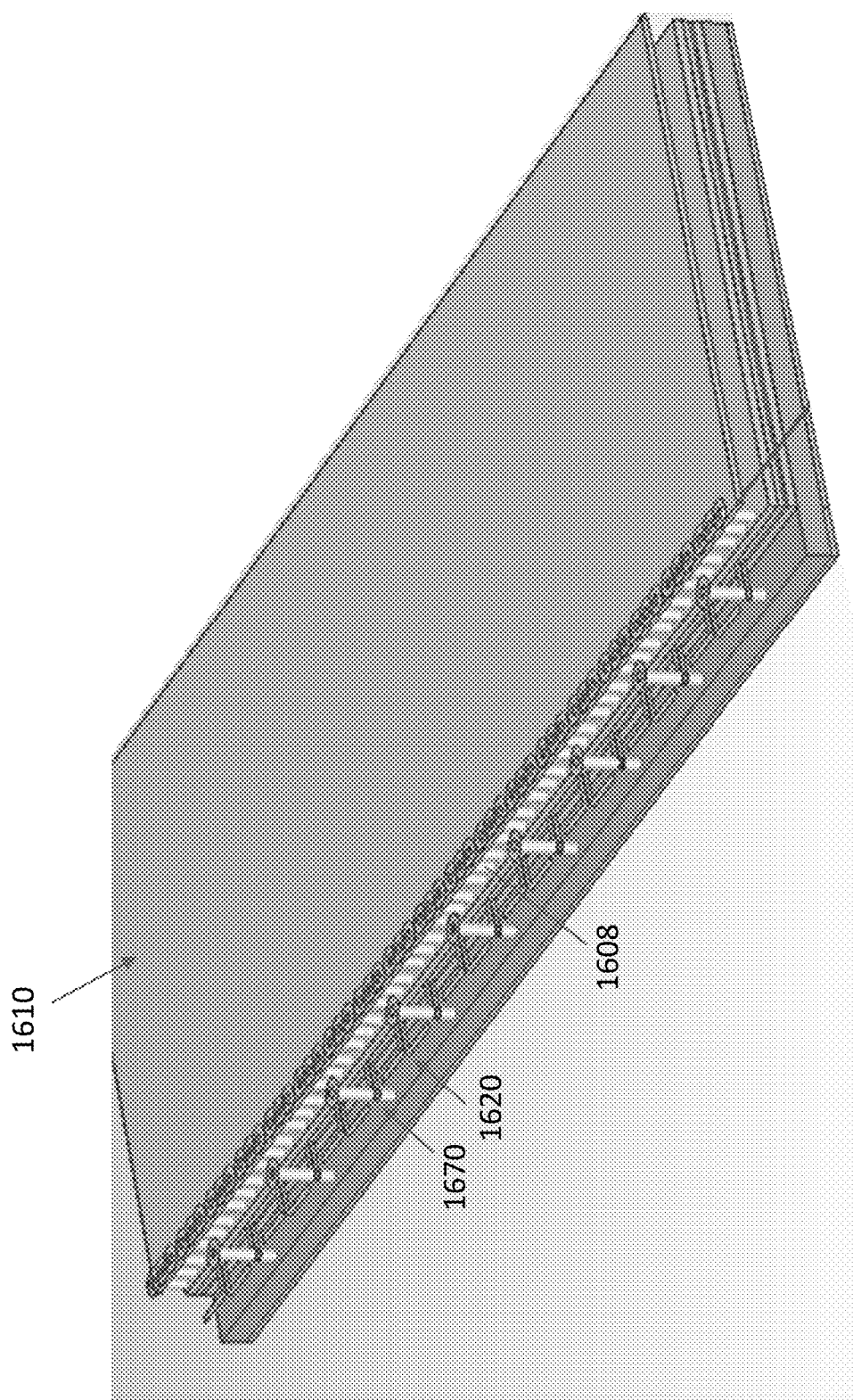

MILLIMETER WAVE ANTENNA ARRAY

PRIORITY

Any and all applications for which a foreign or domestic priority claim is identified in the Application Data Sheet as filed with the present application are hereby incorporated by reference under 37 CFR 1.57.

This application is a continuation of, and claims the benefit of priority to, U.S. patent application Ser. No. 16/903,169, filed Jun. 16, 2020 of the same title, which claims the benefit of priority to U.S. Provisional Application No. 62/862,516, filed Jun. 17, 2019 of the same title, each of the foregoing being incorporated herein by reference in its entirety.

BACKGROUND

Field of the Disclosure

Embodiments described herein relate to antenna arrays, and in particular to two-dimensional antenna arrays which can be used in conjunction with beamforming circuitry.

Description of the Related Art

In some embodiments, a two-dimensional array of antenna elements can be formed on a single substrate. However, the controlling circuitry used in conjunction with such an antenna array may have a footprint considerably larger than the antenna array itself. This can be of particular concern where the antenna array is configured for operation at shorter wavelengths, such as in the millimeter wave band.

In some embodiments, the controlling circuitry can be supported by one or more additional substrates distinct from the antenna array substrate itself. In some particular embodiments, the antenna array substrate may be positioned at an angle to a plurality of printed circuit boards (PCBs) supporting circuitry for controlling the array of antenna element. However, a suitable interface between the PCBs and the non-coplanar substrate supporting the antenna elements can be complex, presenting difficulties with respect to both design and manufacture.

SUMMARY

In one broad aspect, an antenna array is provided, including a backplane, and a plurality of printed circuit boards supported at a first edge by the backplane, the plurality of printed circuit boards arranged parallel to and spaced apart from one another, each of the plurality of printed circuit boards including a linear array of dipole antenna elements arranged along a second free edge of the printed circuit board opposite the first edge of the printed circuit board, the linear arrays of dipole antenna elements on each of the plurality of printed circuit boards cooperating with one another to form a two-dimensional array of printed circuit boards.

In some embodiments, the printed circuit boards can be orthogonal to the backplate. In some embodiments, each of the plurality of printed circuit boards can support a beamforming integrated circuit operably connected to at least a portion of the linear array of dipole antenna elements. In some embodiments, each of the plurality of printed circuit boards can support a second beamforming integrated circuit operably connected to at least a portion of the linear array of dipole antenna elements. In some embodiments, each of the plurality of printed circuit boards can support a plurality of switches, each of the plurality of switches arranged between the beamforming integrated circuit and a dipole antenna element of the linear array of dipole antenna elements.

In some embodiments, each of the plurality of printed circuit boards can include a first portion proximate the backplane and having a first thickness and a second portion proximate the second edge of the printed circuit board and having a second thickness greater than the first thickness. In some embodiments, each of the plurality of printed circuit boards can include a thermal dissipation structure supported by the first portion of the printed circuit board. In some embodiments, the thermal dissipation structure can include a plurality of fins.

In some embodiments, the linear array of dipole antenna elements can be at least partially embedded within the second portion of the printed circuit board. In some embodiments, the linear array of dipole antenna elements can include a first subset of dipole antenna elements oriented in a first direction and a second subset of dipole antenna elements oriented in a second direction. In some embodiments, the first subset of dipole antenna elements can be horizontally oriented and include a pair of parallel, non-coplanar sections, and the second subset of dipole antenna elements can be vertically oriented and include a pair of axially aligned vias spaced apart from one another. In some embodiments, the dipole antenna elements of the first subset of dipole antenna elements can alternate with the dipole antenna elements of the second subset of dipole antenna elements along the length of the linear array of dipole antenna elements.

In some embodiments, each of the plurality of printed circuit boards can also include a ground plane oriented substantially parallel to a major surface of the printed circuit board, and a plurality of conductive vias oriented orthogonally to the ground plane and connected to the ground plane. In some embodiments, the plurality of conductive vias can be arranged in a pattern extending generally parallel to the second edge of the circuit board, and the linear array of dipole elements can be located between the plurality of conductive vias and the second edge of the printed circuit board.

In another broad aspect, a printed circuit is provided, the printed circuit board configured to cooperate with a plurality of printed circuit boards to form a two-dimensional array of antenna elements, the printed circuit board including a first section proximate a first edge of the printed circuit board, the printed circuit board configured to be supported at first edge of the printed circuit board by a backplane, the first section having a first thickness, a second section proximate a second edge of the printed circuit board, the second edge of the printed circuit board having a second thickness greater than the first thickness, a linear array of dipole antenna elements embedded at least partially within the second section of the printed circuit board adjacent the second edge of the printed circuit board, beamforming circuitry supported by the printed circuit board and in electrical communication with the linear array of dipole antenna elements, and a thermal dissipation structure supported by the first section of the printed circuit board.

In some embodiments, the linear array of dipole antenna elements can include a plurality of horizontally-oriented dipole antenna elements alternating with a plurality of vertically-oriented dipole antenna elements. In some embodiments, the plurality of vertically-oriented dipole antenna elements can include a plurality of vertically-extending dipole vias, and the printed circuit board can also include a plurality of vertically-extending ground vias, where the vertically-extending dipole vias can be located closer to the second edge of the printed circuit board than the vertically-extending ground vias.

BRIEF DESCRIPTION OF THE DRAWINGS

The foregoing and other features of the present disclosure will become more fully apparent from the following description and appended claims, taken in conjunction with the accompanying drawings. Understanding that these drawings depict only several embodiments in accordance with the disclosure and are not to be considered limiting of its scope, the disclosure will be described with additional specificity and detail through use of the accompanying drawings. In the following detailed description, reference is made to the accompanying drawings, which form a part hereof. In the drawings, similar symbols typically identify similar components, unless context dictates otherwise.

FIG. 16A is a partial cutaway perspective view of an alternative embodiment of a PCB which can form a part of a dual-polarized antenna array.

While the above-identified drawings set forth presently disclosed embodiments, other embodiments are also contemplated, as noted in the discussion. This disclosure presents illustrative embodiments by way of representation and not limitation. Numerous other modifications and embodiments can be devised by those skilled in the art which fall within the scope and spirit of the principles of the presently disclosed embodiments.

DETAILED DESCRIPTION

In some embodiments, a two-dimensional antenna array can be formed across a plurality of discrete printed circuit boards (PCBs) or other supporting substrate, with each of the plurality of PCBs having a linear array of antenna elements formed thereon. When the PCBs are arranged relative to one another, the linear arrays of antenna elements formed on each of the PCBs can cooperate to form the two-dimensional antenna array.

In providing a multi-dimensional array of antenna elements spread across a plurality of distinct PCBs, each PCB can support controlling circuitry, such as beamforming circuitry, which can control the operation of those antenna elements on the same PCB. Such an arrangement can provide multiple substrates for supporting controlling circuitry and other components of the antenna array, while avoiding the need to design and fabricate a complex interface between a common antenna array substrate and a plurality of additional substrates. This arrangement can also be beneficial with respect to thermal management of the antenna array and controlling circuitry.

While the structures described herein can be adapted for use with a wide range of operational frequencies, the structures may be particularly suited for use with frequencies in or near the millimeter wave range. In some embodiments, the operational frequency of the antenna array may be between 20 GHz and 39 GHz. In some particular embodiments, the operational frequency of the antenna array may be between 24 and 30 GHz. In some exemplary embodiments, the antenna arrays can be used with frequencies at or around 28 GHz, or at or around 39 GHz. Other frequencies higher and lower than these ranges may also be used.

Figure 1:
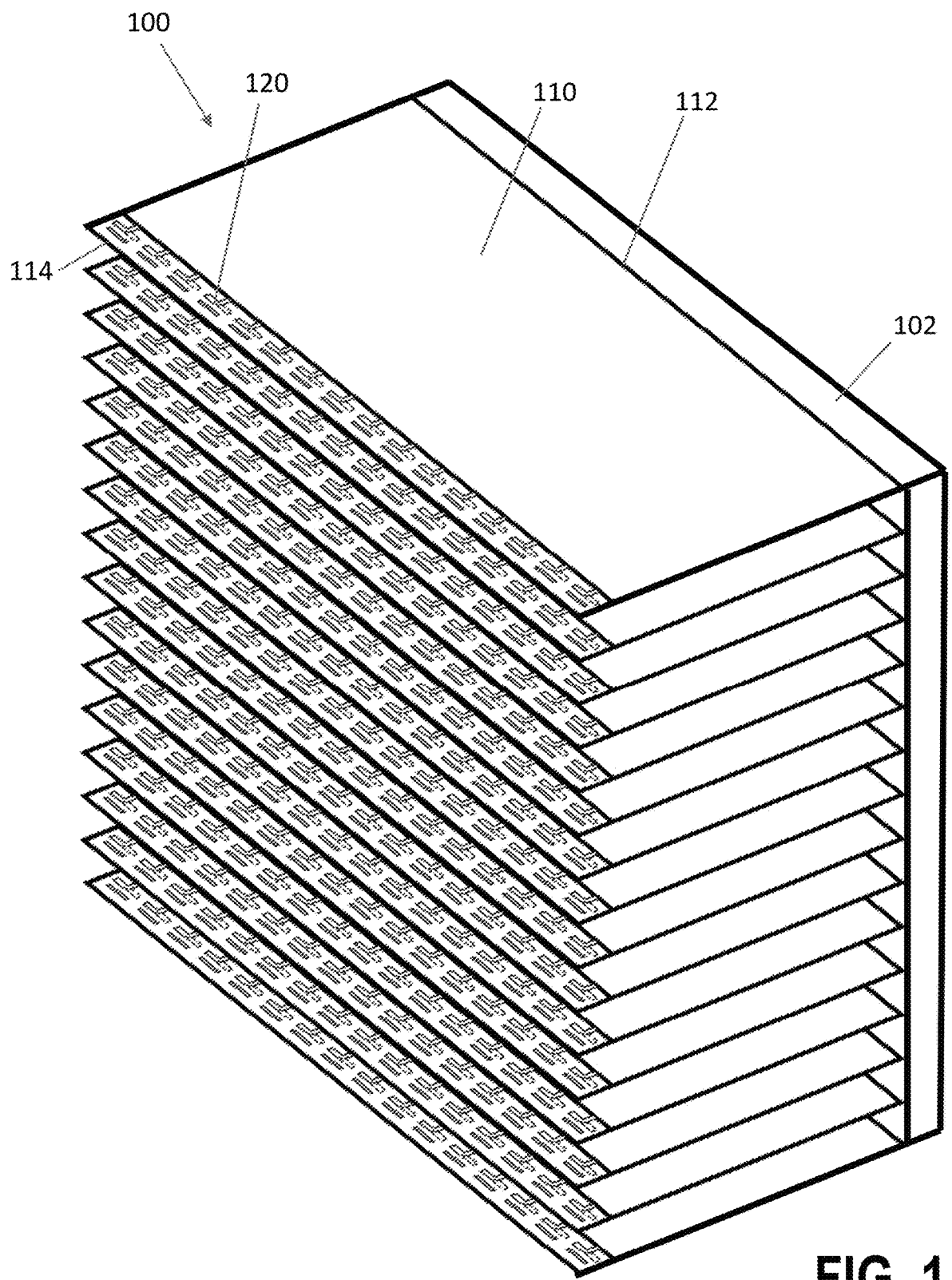
FIG. 1 is a perspective view schematically illustrating a two-dimensional array of antenna elements comprising antenna elements at the free ends of each of a plurality of cantilevered printed circuit boards (PCBs).

FIG. 1 is a perspective view schematically illustrating a two-dimensional array of antenna elements comprising antenna elements at the free ends of each of a plurality of cantilevered printed circuit boards (PCBs).

FIG. 1 illustrates an antenna array 100 including a plurality of printed circuit boards (PCBs) 110. The plurality of PCBs 110 are arranged generally parallel to one another, and are supported at one end 112 by a backplane 102. The opposite ends 114 of the PCBs 110 are free ends, such that the PCBs 110 are supported in a cantilevered arrangement by the backplane 102.

A linear array of antenna elements 120 are formed along each of the free ends 114 of the PCBs 110, opposite the backplane 102. The linear arrays of antenna elements 120 along each of the free ends 114 of the PCBs 110 cooperate with one another to form a two-dimensional array of antenna elements 120, in which each row of the antenna elements 120 is located on a different PCB 110.

Figure 2:
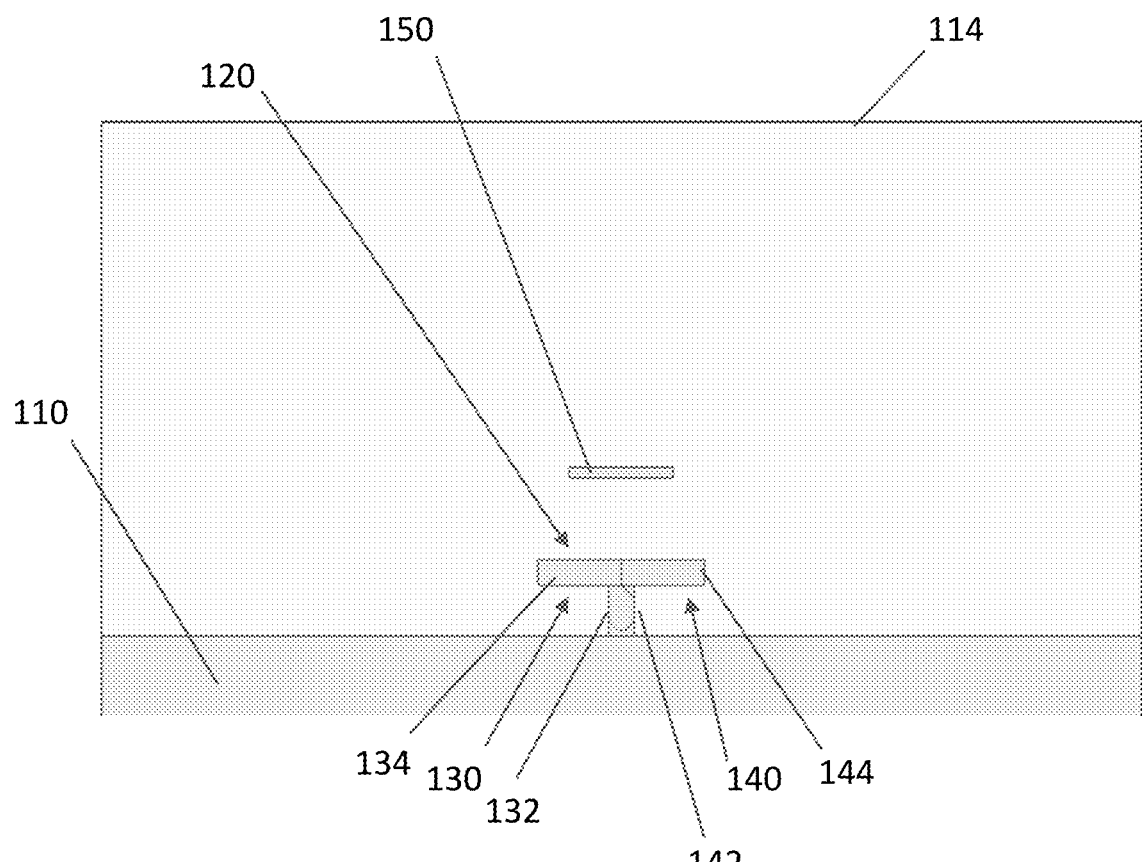
FIG. 2 is a top plan view of PCB section illustrating an exemplary dipole antenna element design.

FIG. 2 is a top plan view of PCB section illustrating an exemplary dipole antenna element design. Dipole antenna 120 may include a first dipole arm 130 including a proximal section 132 extending normal to the backplane and a distal section 134 extending perpendicularly from the proximal section 132 in a first direction parallel to the backplane. Dipole antenna 120 also includes a second arm 140 including a proximal section 142 extending normal to the backplane and a distal section 144 extending perpendicularly from the proximal section 142 in a second direction opposite the first direction in which the distal section 134 of the first dipole arm 140 extends.

The proximal sections 132 and 142 of the first and second dipole arms 130 and 140 may comprise parallel, overlapping striplines, and the distal sections 134 and 144 may be parallel striplines which extend in opposite directions, and do not have substantial overlap.

In the illustrated embodiment, the PCB also includes a director 150 which includes a strip located outward of the dipole arms 130 and 140, closer to the free end 114 of the PCB 110. The edges of the dipole arms 130 and 140 may extend farther outward than the edges of the director 150. The director 150 may be coplanar with one of the dipole arms 130 or 140.

In the illustrated arrangement, the two dipole arms 130 and 140 are located within parallel respective planes, and the two dipole arms 130 and 140 may be separated by at least one sublayer of the PCB 110. Because all of the dipole arms 130 are coplanar with one another, and all of the dipole arms 140 are also coplanar with one another, the distal portion of the PCB 110 in which the dipole antenna elements 120 are defined may be comparatively thin, and the proximal portion of the PCB 110 may be comparatively thicker to provide additional structures. In some embodiments, a proximal section of at least one of the dipole arms may be in contact with a ground plane within or on a surface of the PCB 110 in the thicker proximal portion of the PCB 110.

In some embodiments, the dipole arms 130 and 140 may be etched or otherwise formed on exposed opposite sides of a PCB sublayer. In other embodiments, as discussed in greater detail below, the dipole arms 130 and 140 may be embedded within the PCB, with surrounding sublayers on one or both sides of the PCB, and the distal portion of the PCB may be thicker to accommodate the additional sublayers and other components.

As discussed in greater detail below, the PCBs 110 may support beamforming circuitry (not shown in FIGS. 1 and 2), which can be used to control the operation of the antenna elements on that PCB 110. The beamforming circuitry may comprise integrated circuits (ICs), also referred to as radio frequency integrated circuits (RFICs). The beamforming circuitry may be used to steer the antenna.

Because each PCB can support beamforming circuitry and other components used to control the antenna elements on that PCB, the multilayer PCB arrangement provides an amount of available surface area which can be substantially larger than the dimensions of the antenna array itself, while occupying a comparatively small volume.

Figure 3:
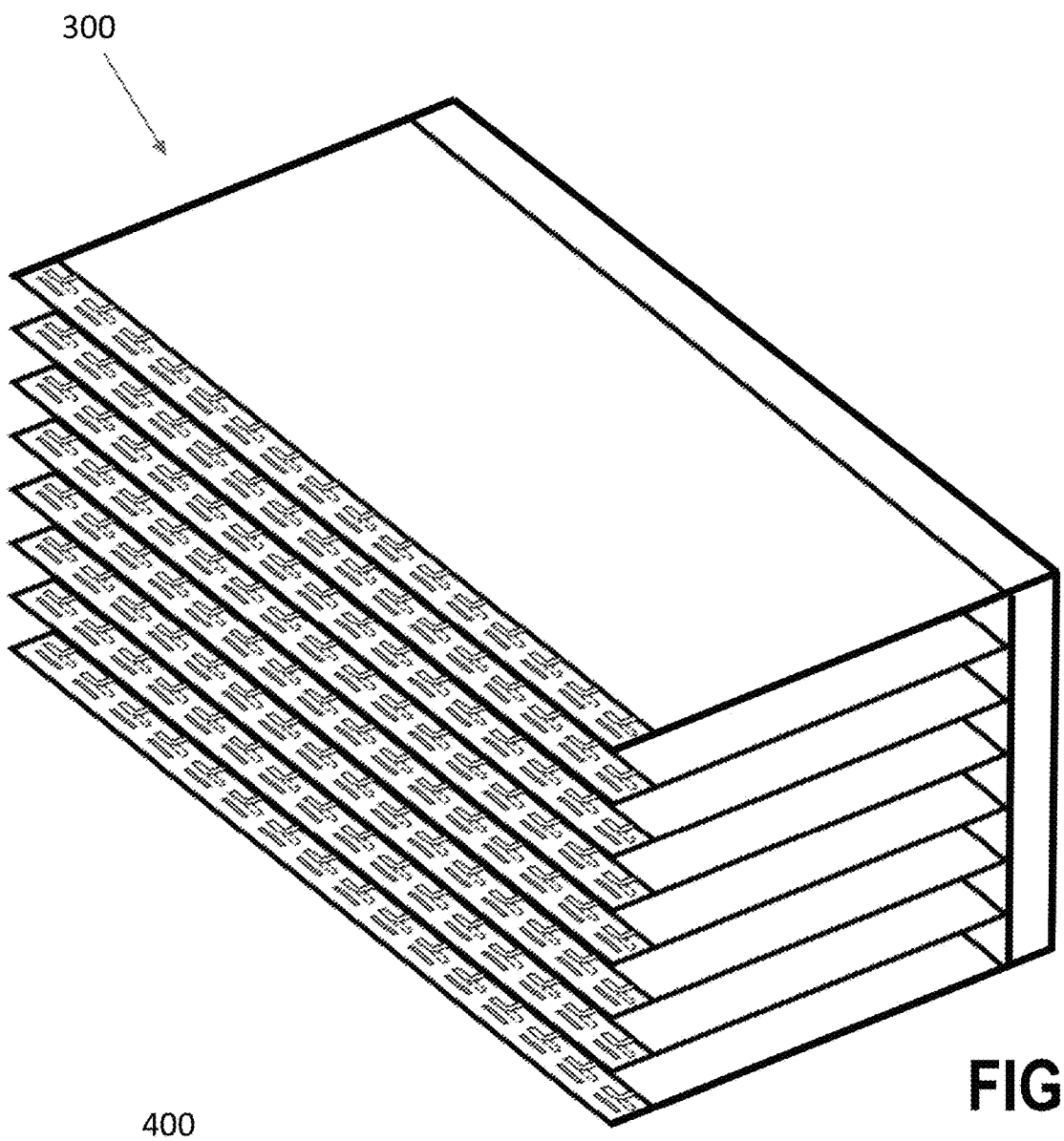
FIG. 3 is a perspective view schematically illustrating an exemplary 8×16 array of dipole antenna elements formed near the free edges of eight distinct PCBs.
Figure 4:
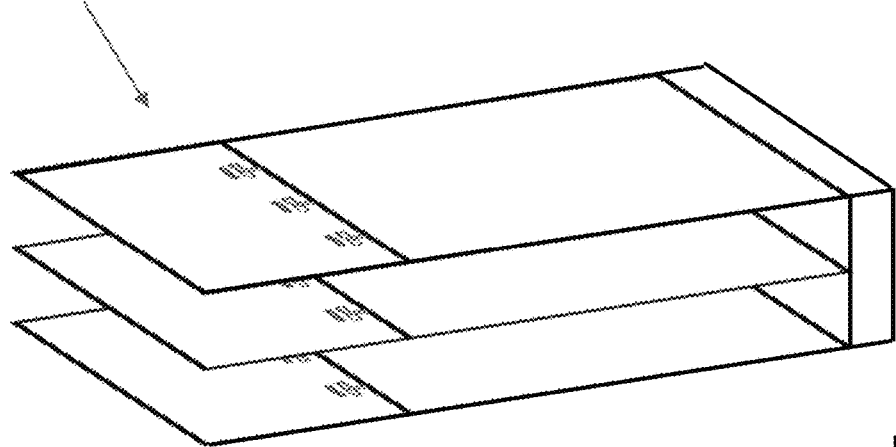
FIG. 4 is a perspective view schematically illustrating an exemplary 3×3 array of dipole elements formed near the free edges of three distinct PCBs.

FIG. 3 is a perspective view schematically illustrating an 8×16 array 300 of dipole elements, which can also be used in the generation of simulation results, as discussed in greater detail below. FIG. 4 is a perspective view schematically illustrating an exemplary 3×3 array 400 of dipole elements. This 3×3 array may be used to model antenna behavior, such as the effects of neighboring dipoles, and may represent a subset of a larger array.

The scan loss of a given antenna array will control the usable angular scan range of the array. The scan loss may be a function, in part, of the array geometry, including the number of elements and the spacing between those elements. The scan loss may also be a function of the element type used to populate the array. However, the array geometry affects scan loss independent of the particular antenna array element type used.

Figure 5:
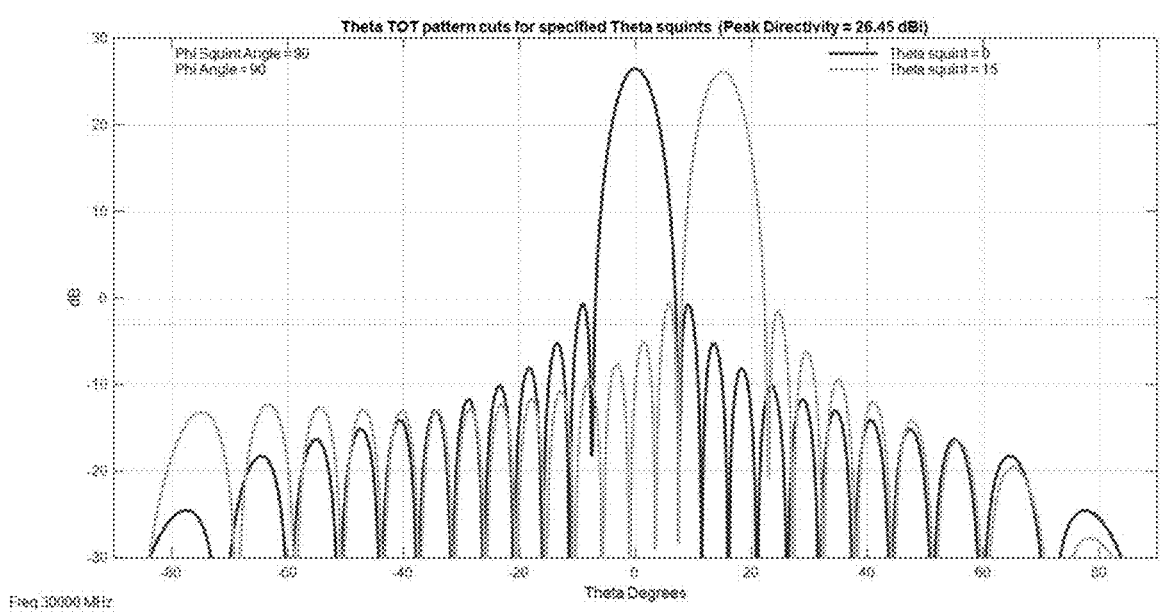
FIG. 5 is a plot illustrating elevation scanning of an exemplary antenna array.

FIG. 5 is a plot illustrating elevation scanning of an antenna array geometry as a function of scan angle theta, where the elements are spaced 0.72 wavelengths apart (7.2 mm) along the elevation axis, with no grating lobe at 30.0 GHz. A 27 dB Taylor distribution was used in the generation of this plot. In an embodiment in which the scan requirement for an antenna array in elevation is lower than the scan requirement in azimuth, larger element spacing along the elevation axis may be used.

Figure 6A:
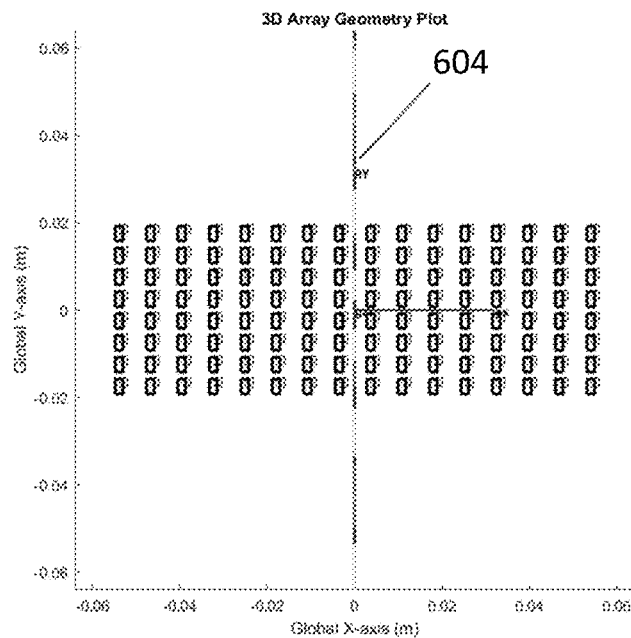
FIG. 6A is a top plan view schematically illustrating an antenna array such as the array of FIG. 4.
Figure 6B:
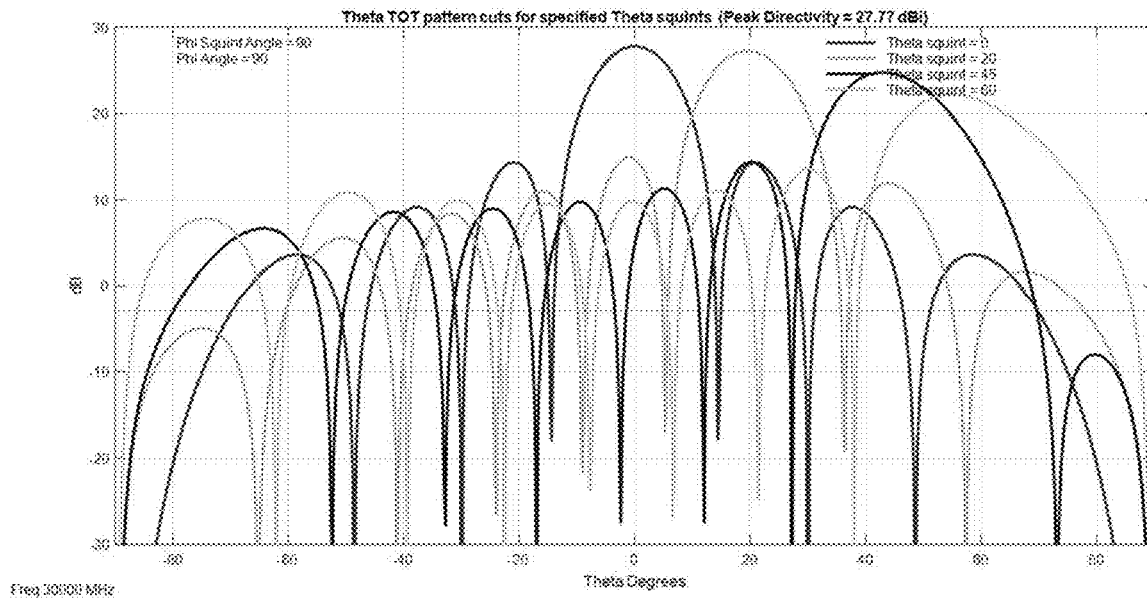
FIG. 6B is a plot illustrating azimuth scanning of the antenna array of FIG. 6A using a uniform distribution.

FIG. 6B is a plot illustrating azimuth scanning of an antenna array geometry as a function of scan angle theta, where the elements are spaced 0.5 wavelengths apart (5.14 mm) along the azimuth axis, with no grating lobe at 30.0 GHz. A uniform distribution was used in the generation of this plot. FIG. 6A illustrates the plane 604 along which the cuts of FIG. 6B are made, shown relative to the 8×16 antenna array 600 such as the array 300 of FIG. 3.

Figure 7A:
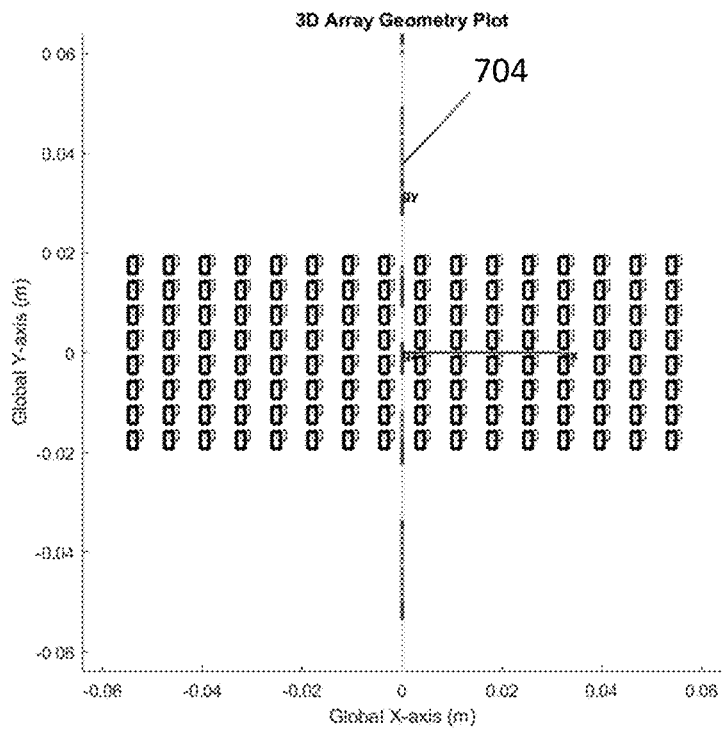
FIG. 7A is a top plan view schematically illustrating an antenna array such as the array of FIG. 4.
Figure 7B:
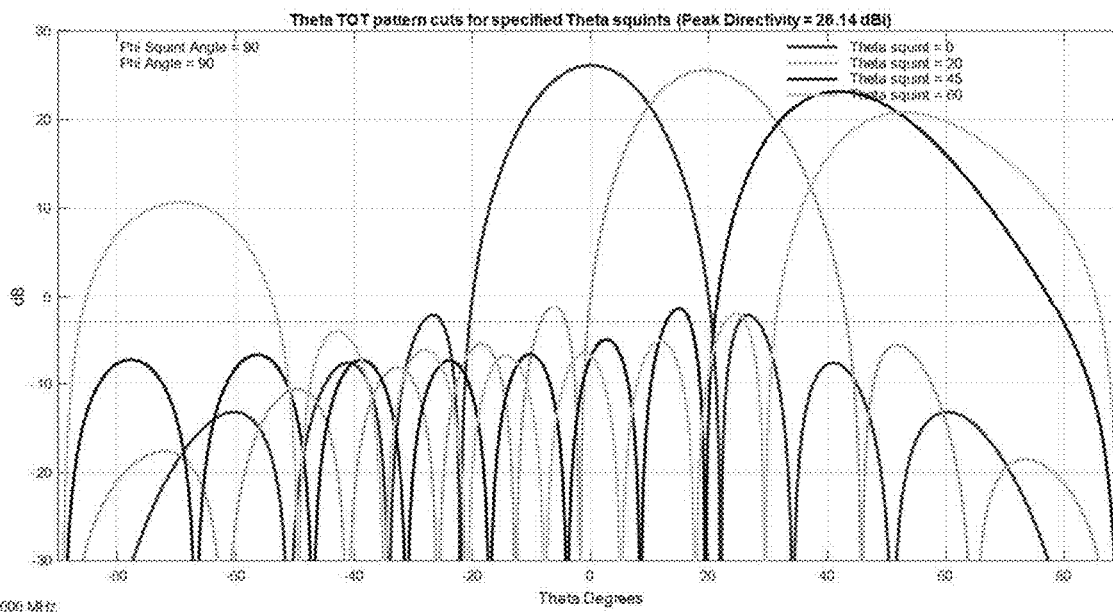
FIG. 7B is a plot illustrating azimuth scanning of the antenna array of FIG. 7A using a Taylor distribution.

FIG. 7B is another plot illustrating azimuth scanning of an antenna array geometry as a function of scan angle theta, where the elements are spaced 0.5 wavelengths apart (5.14 mm) along the azimuth axis, with no grating lobe at 30.0 GHz. A 27 dB Taylor distribution was used in the generation of this plot. FIG. 7A illustrates the plane 704 along which the cuts of FIG. 7B are made, shown relative to the 8×16 antenna array 700 such as the array 300 of FIG. 3.

Figure 8:
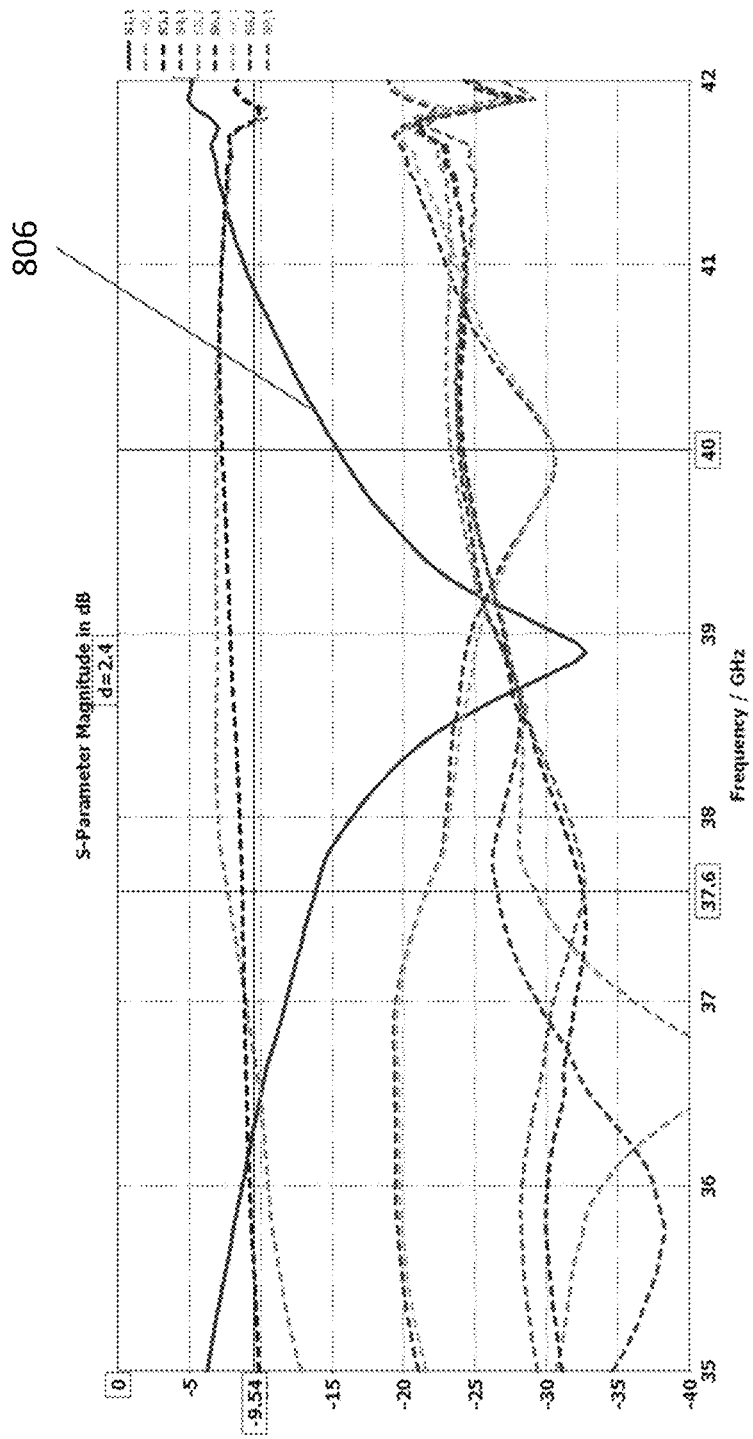
FIG. 8 is a plot of return loss of the center dipole of a 3×3 array such as the array of FIG. 4.

FIG. 8 is a plot of return loss of the center dipole of a 3×3 array such as the array 400 of FIG. 4. The solid line 806 represents the return loss of the center dipole, and the dashed lines represent the isolation between the center dipole and each of the surrounding 8 dipoles.

Figure 9A:
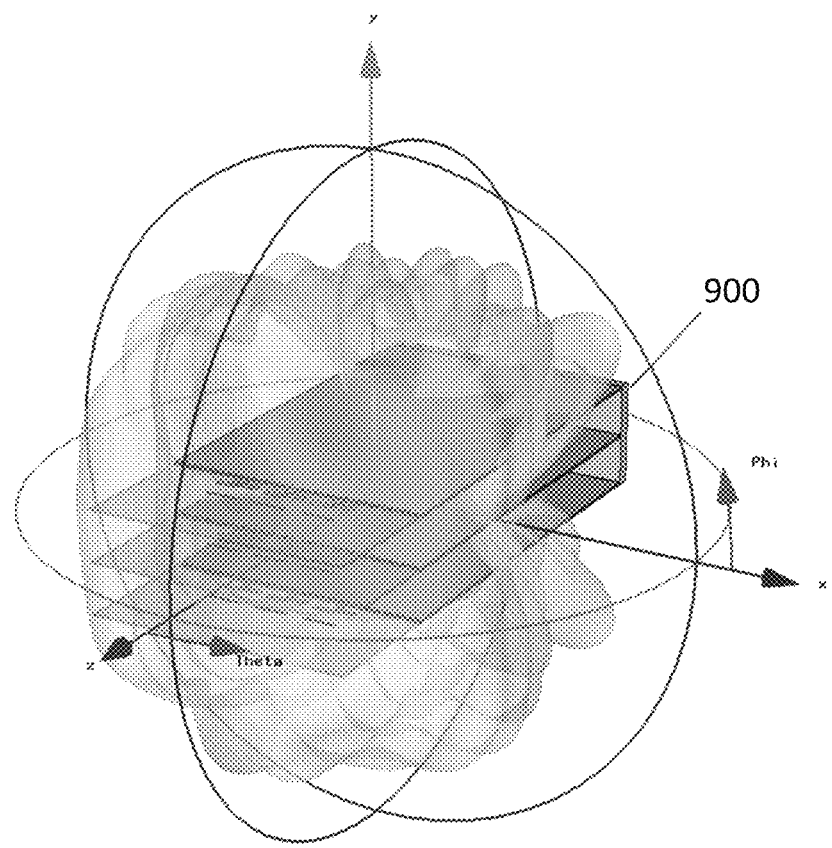
FIG. 9A is a perspective view illustrating a simulation model and coordinate system for a 3×3 array such as the array of FIG. 4.
Figure 9B:
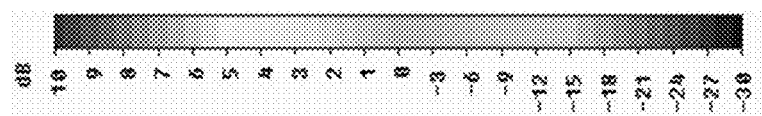
FIG. 9B is a perspective view illustrating the far field radiation pattern of a single element of the array at 38.8 GHz.
Figure 9B:
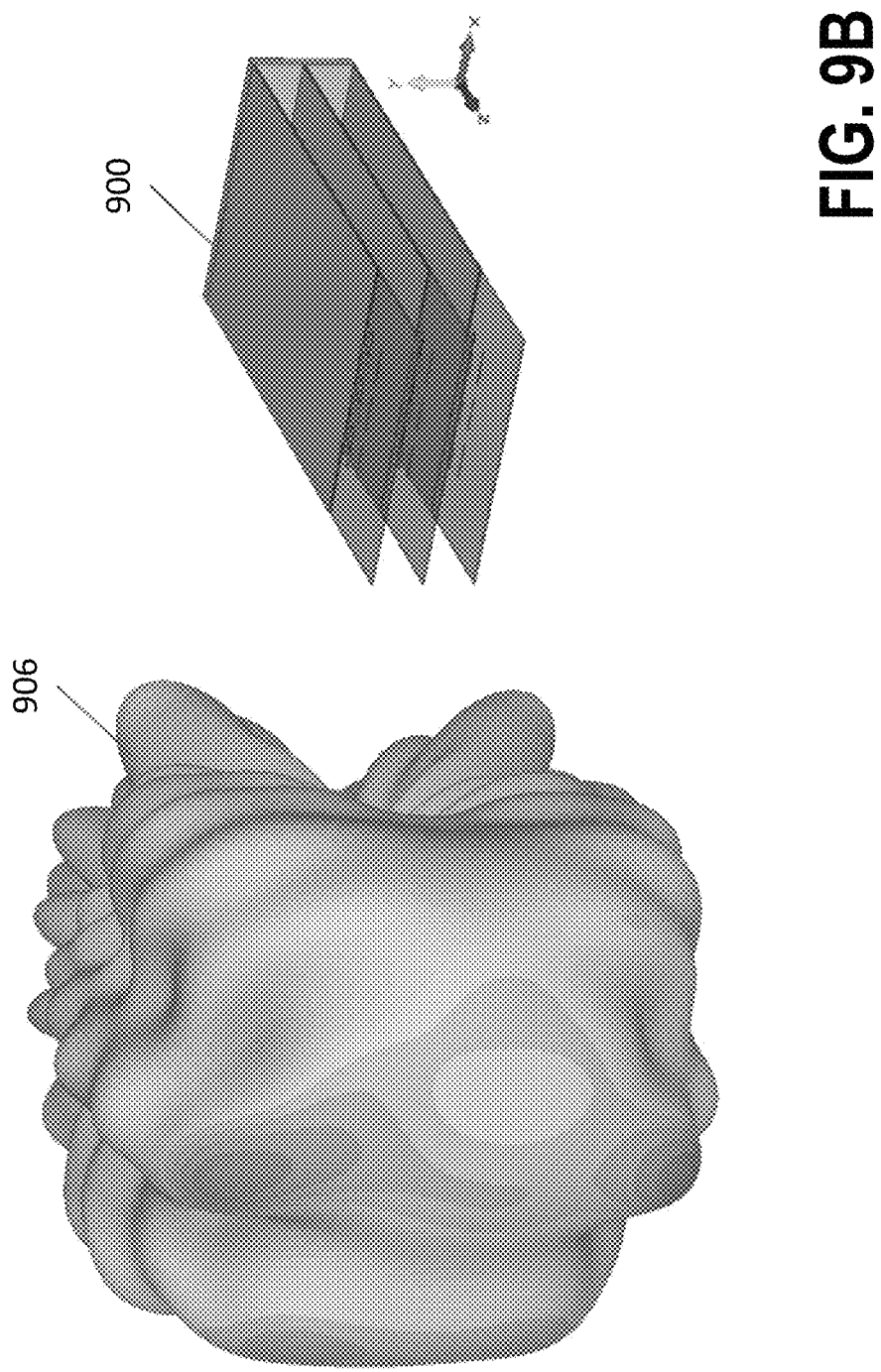

FIG. 9A is a perspective view illustrating a simulation model and coordinate system for a 3×3 array 900 such as the array 300 of FIG. 3. FIG. 9B is a perspective view illustrating the far field radiation pattern 960 of a single element of the array 900 at 38.8 GHz.

Figure 10A:
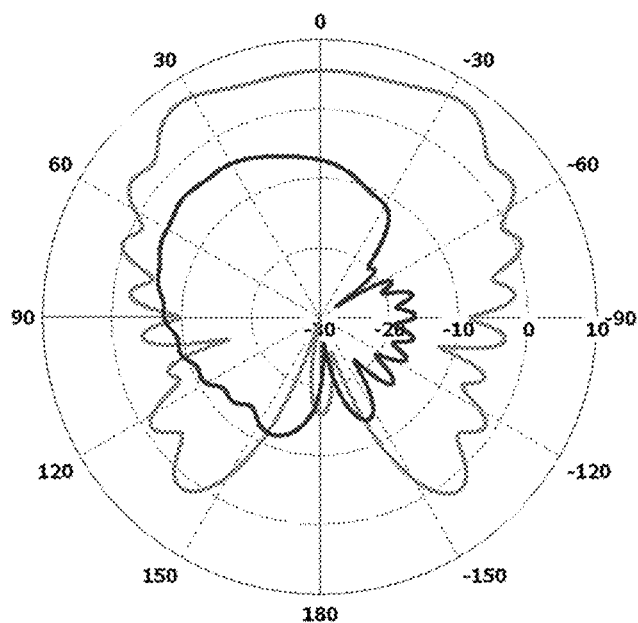
FIG. 10A is a plot of a Y-Z planar cut of the far field radiation pattern of the center dipole of a 3×3 array such as the array of FIG. 9A at 38.8 GHz.
Figure 10B:
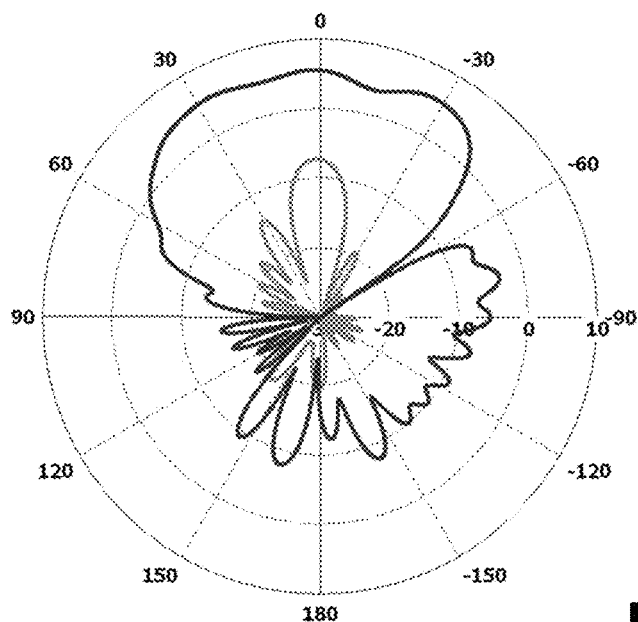
FIG. 10B is a plot of an X-Z planar cut of the far field radiation pattern of the center dipole of the 3×3 array at 38.8 GHz.

FIG. 10A is a plot of a Y-Z planar cut of the far field radiation pattern of the center dipole of a 3×3 array such as array 900 at 38.8 GHz. The 3 dB beamwidth is 116 degrees, and the 10 dB beamwidth is 153 degrees. FIG. 10B is a plot of an X-Z planar cut of the far field radiation pattern of the center dipole of the 3×3 array at 38.8 GHz.

Figure 11A:
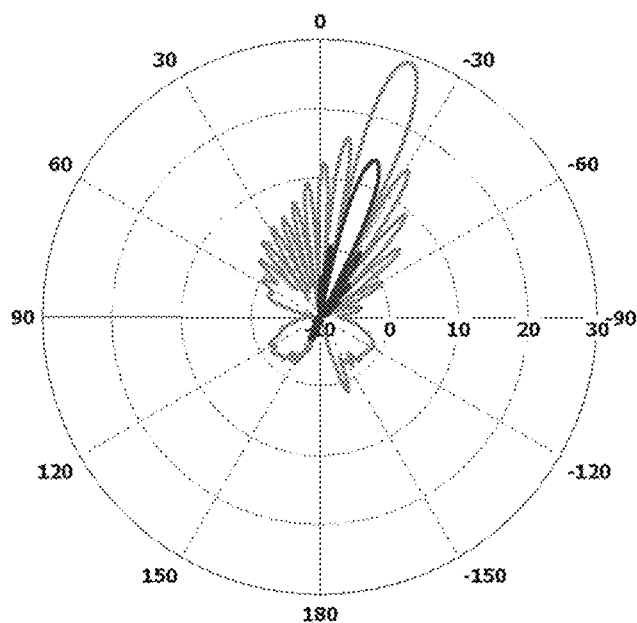
FIGS. 11A and 11B are Y-Z planar cuts of the far field radiation pattern of the center dipole of a 16×16 array such as the array of FIG. 1 at 38.8 GHz.
Figure 11B:
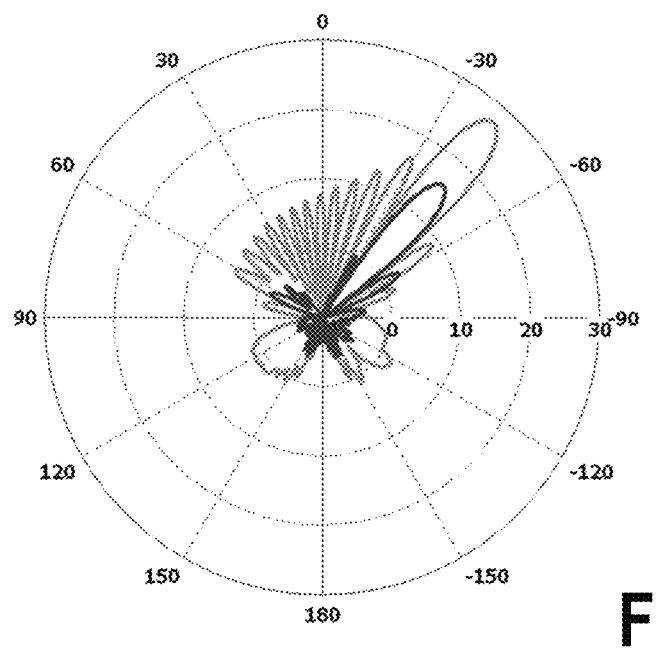

FIGS. 11A and 11B are Y-Z planar cuts of the far field radiation pattern of the center dipole of a 16×16 array such as array 100 at 38.8 GHz. In FIG. 11A, the radiation pattern is steered towards an angle of 19.5 degrees along the Y-Z axis, with a peak gain of 28.9 dB. The first side lobe level is 12.7 dB, and the 3 dB beamwidth is 6.7 degrees. In FIG. 11B, the radiation pattern is steered towards an angle of 41 degrees along the Y-Z axis, with a peak gain of 27.4 dB. The first side lobe level is 11.1 dB, and the 3 dB beamwidth is 8.2 degrees.

Figure 12:
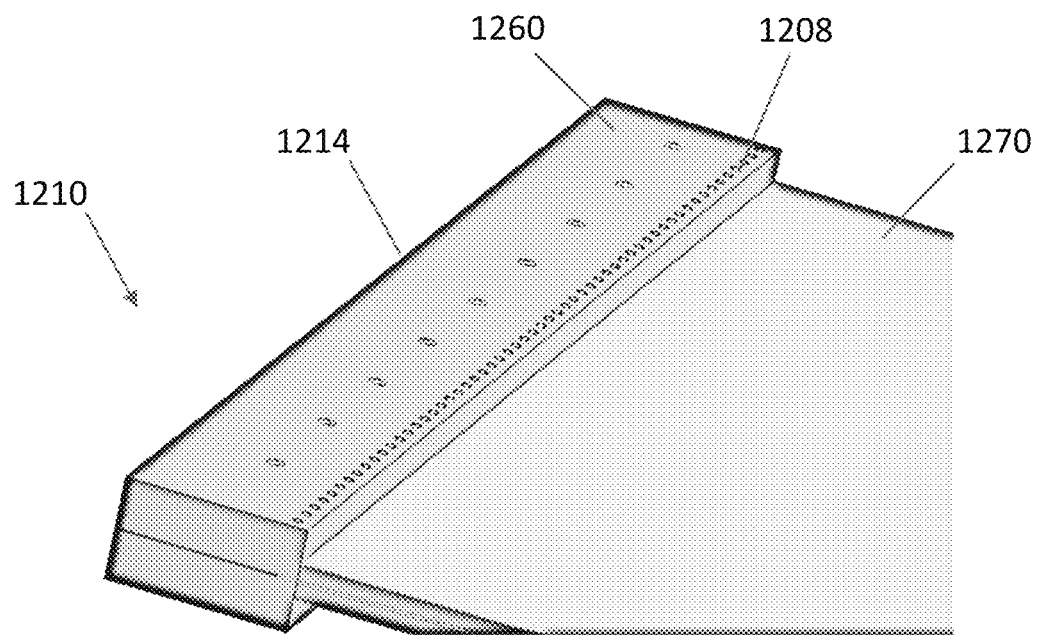
FIG. 12 is a perspective view of one embodiment of a PCB which can be used in a dual polarized array including a plurality of alternately polarized elements.

In some embodiments, dual polarization may be required. In such embodiments, an antenna array of alternately polarized elements can be used. FIG. 12 is a perspective view of one embodiment of a PCB which can be used in such an array. As can be seen in FIG. 12, a distal portion 1260 at the free end 1214 of the PCB 1210 can be thicker than a proximal portion 1270 closer to the end at which the PCB 1210 will be supported by a backplane. The additional thickness can accommodate the inclusion of vertically oriented dipole antennas 1270 with sections oriented orthogonal to the major surfaces of the PCB 1210, in addition to horizontally oriented dipole antennas oriented parallel to the major surfaces of the PCB 1210 and which may be embedded within the thick distal portion 1260 of the PCB.

Such a design can provide a combination of vertically polarized dipole antennas and horizontally polarized dipole antennas. In addition, because the PCB design includes both vertically oriented and horizontally oriented dipole antennas, the PCB 1210 may include a plurality of vertically extending vias 1208 which may cooperate to function as a ground plane structure extending generally orthogonal to the major surfaces of the PCB 1210. These vertically extending vias may connect to some or all of the planar ground planes within or on the PCB.

Figure 13:
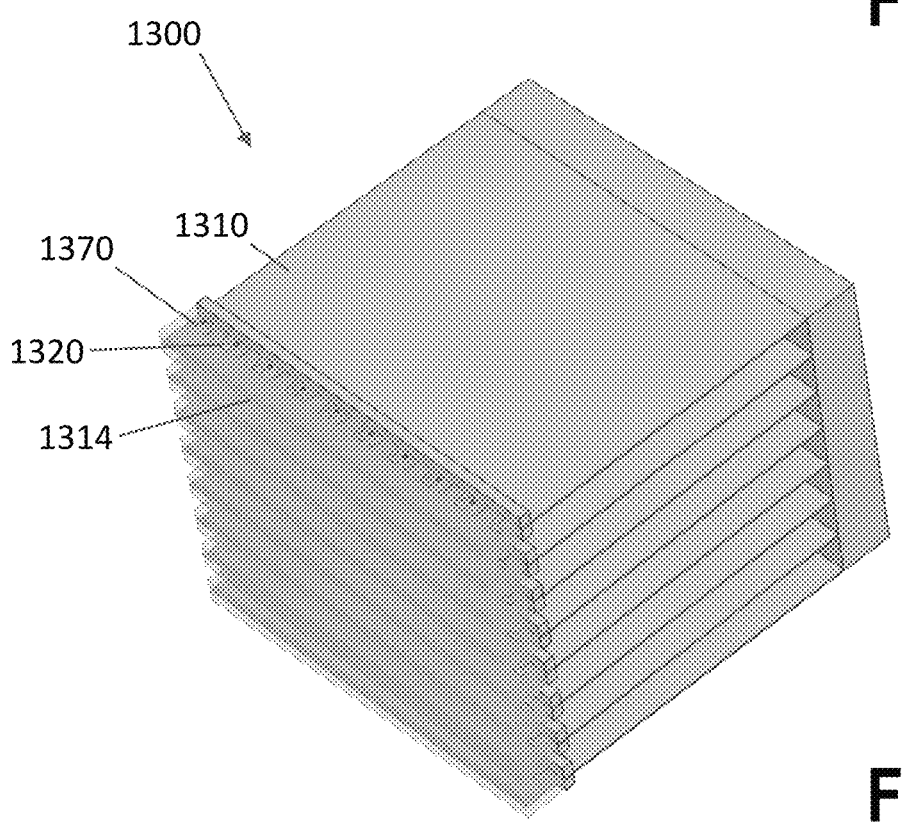
FIG. 13 is a perspective view illustrating a dual polarized antenna array formed by a plurality of PCBs, with alternating horizontally oriented dipole elements and vertically oriented dipole elements.

A particular embodiment of a dual polarized antenna array is shown in FIG. 13. The antenna array 1300 of FIG. 13 includes a plurality of PCBs 1310. Each of these PCBs 1310 include alternating horizontally oriented dipole antennas 1320 and vertically oriented dipole antennas 1370 along their free ends 1314.

Figure 14A:
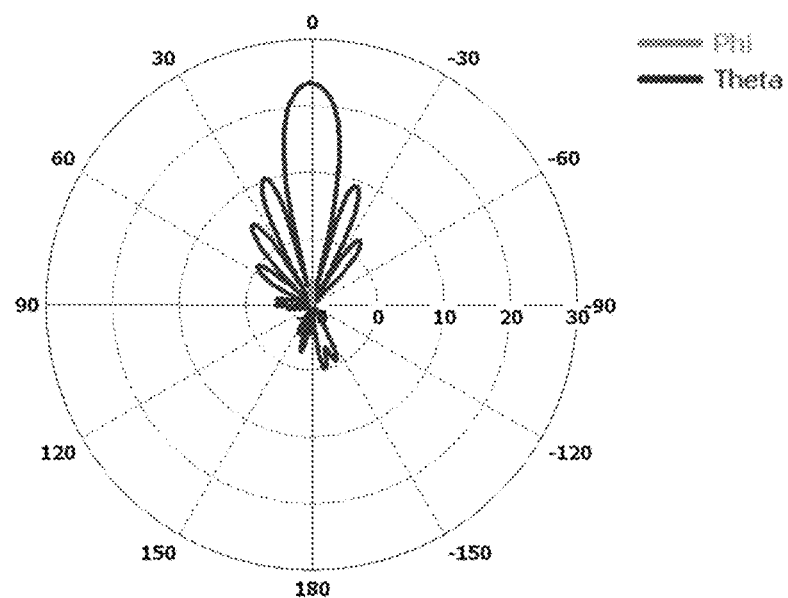
FIGS. 14A and 14B illustrate Y-Z and X-Z planar cuts of the radiation patterns of the horizontally polarized antenna elements of an antenna array such as that of FIG. 13.
Figure 14B:
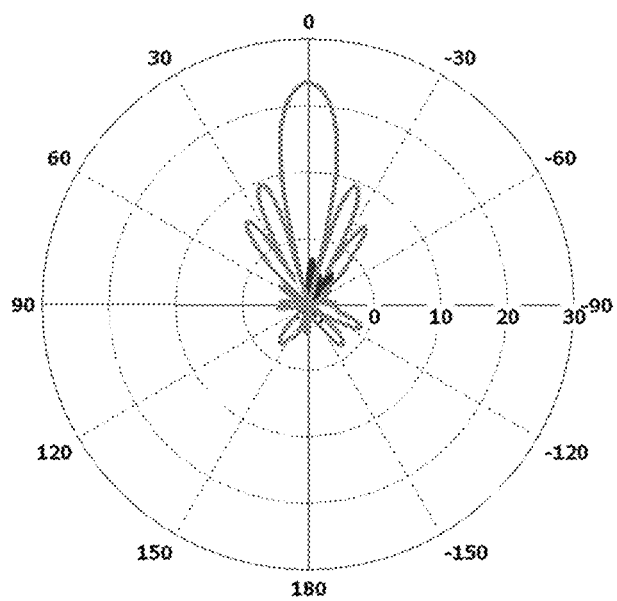

FIGS. 14A and 14B illustrate Y-Z and X-Z planar cuts of the radiation patterns of the horizontally polarized antenna elements of an antenna array such as antenna array 1300. The Y-Z planar cut of FIG. 14A has a peak gain of 23.3 db, a first side lobe level of 13.1 dB, and a 3 dB beamwidth of 12.4 degrees. The X-Z planar cut of FIG. 14B has a peak gain of 23.3 dB, a first side lobe level of 14 dB, and a 3 dB beamwidth of 12.3 degrees.

Figure 15A:
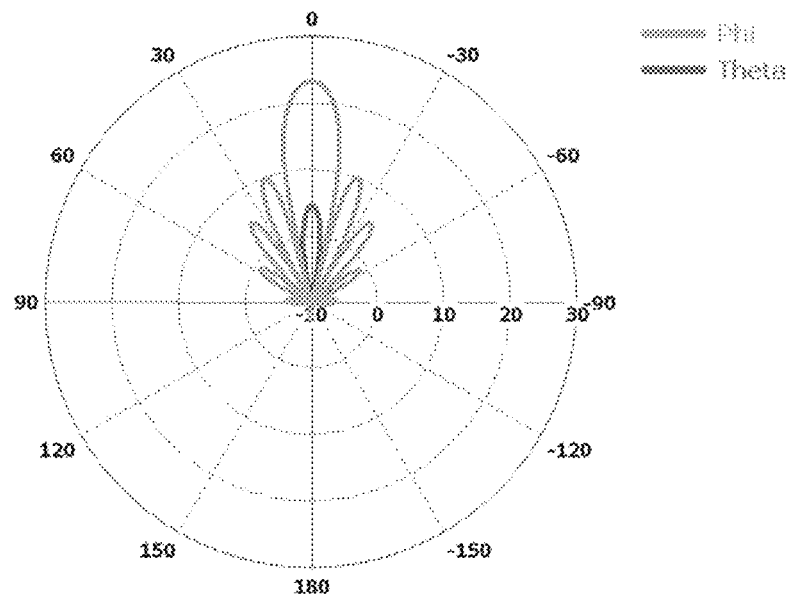
FIGS. 15A and 15B illustrate Y-Z and X-Z planar cuts of the radiation patterns of the vertically polarized antenna elements of an antenna array such as that of FIG. 13.
Figure 15B:
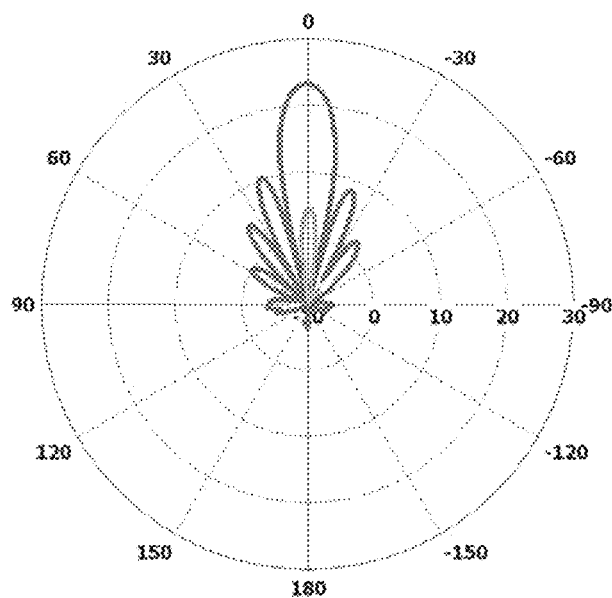

FIGS. 15A and 15B illustrate Y-Z and X-Z planar cuts of the radiation patterns of the vertically polarized antenna elements of an antenna such as antenna 1300. The Y-Z planar cut of FIG. 15A has a peak gain of 23.3 db, a first side lobe level of 13.4 dB, and a 3 dB beamwidth of 12.4 degrees. The X-Z planar cut of FIG. 15B has a peak gain of 23.3 dB, a first side lobe level of 13 dB, and a 3 dB beamwidth of 12.2 degrees.

Figure 16B:
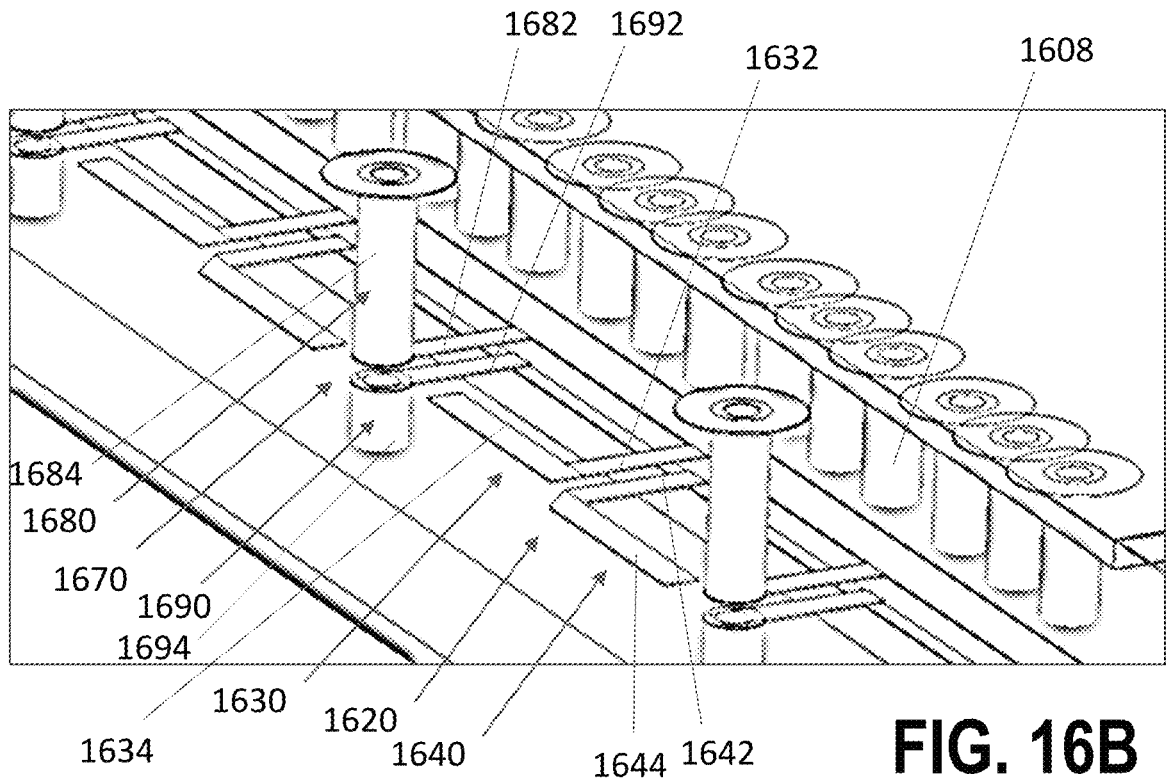
FIG. 16B is a detail partial cutaway perspective view of the PCB of FIG. 16A.
Figure 16C:
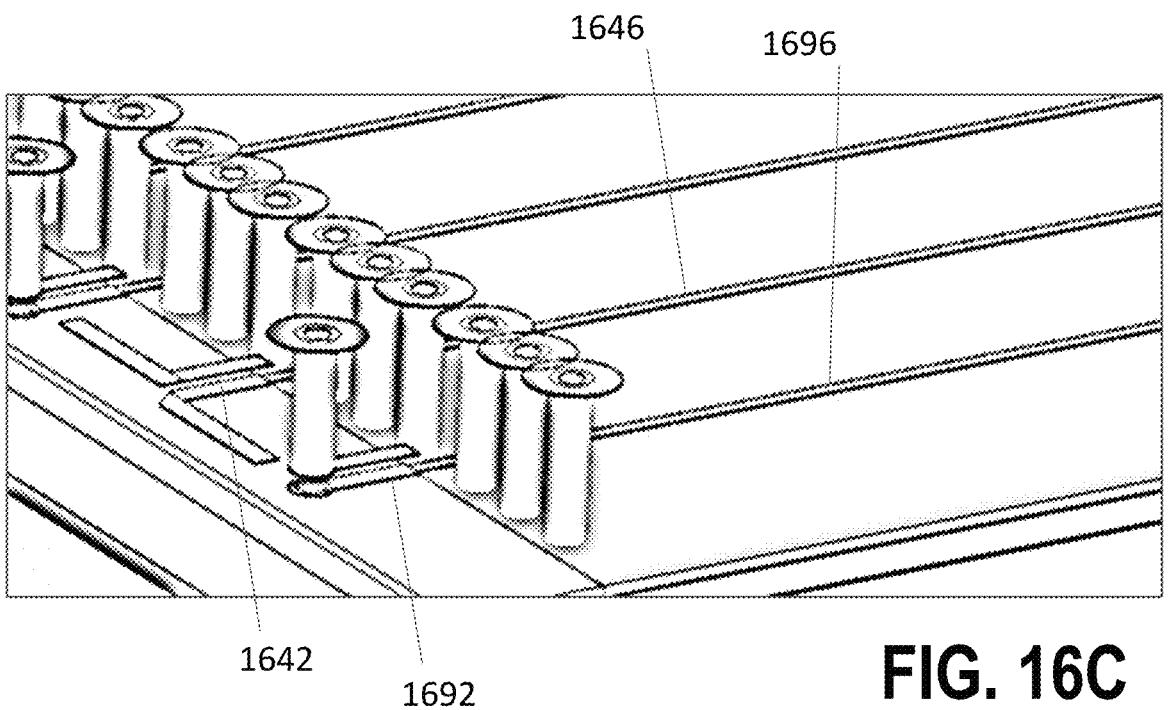
FIG. 16C is another detail partial cutaway perspective view of the PCB of FIG. 16A, showing embedded striplines within the PCB structure.
Figure 16D:
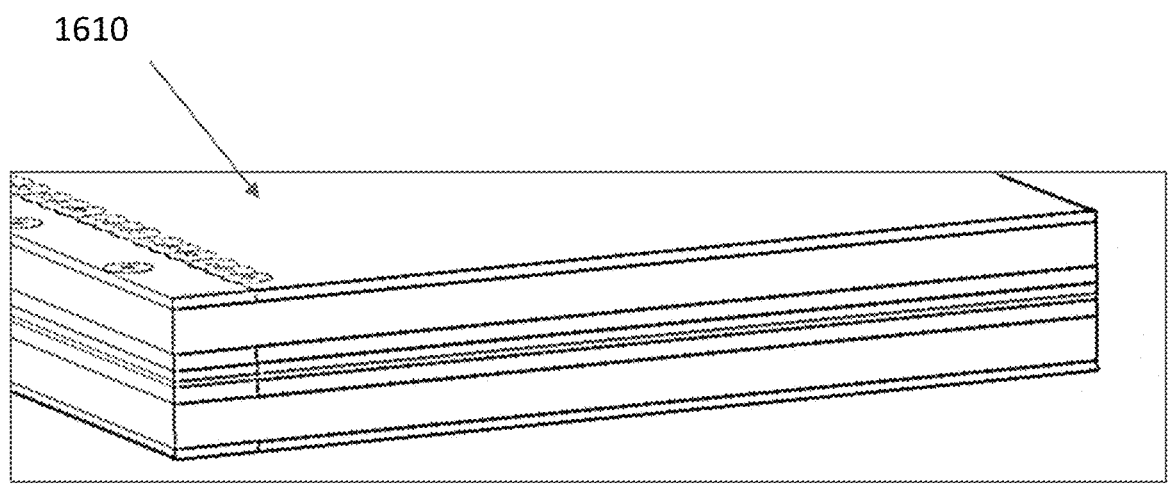
FIG. 16D is a side perspective view of the PCB of FIG. 16A.

FIG. 16A is a partial cutaway view of an embodiment of a PCB 1610 which can form a part of a dual-polarized antenna array. FIG. 16B is a detail partial cutaway perspective view of the PCB of FIG. 16A. FIG. 16C is another detail partial cutaway perspective view of the PCB of FIG. 16A, showing embedded striplines within the PCB structure. FIG. 16D is a side perspective view of the PCB of FIG. 16A.

The PCB 1610 includes both horizontally extending and vertically oriented dipole antenna elements. In particular, the horizontally oriented dipole antenna elements 1620 may include a first dipole arm 1630 including a proximal section 1632 and a distal section 1634 extending perpendicularly from the proximal section 1632 in a first direction parallel to the free end 1612 of the PCB 1610. Horizontally extending dipole antenna element 1620 also includes a second arm 1640 including a proximal section 1642 and a distal section 1644 extending perpendicularly from the proximal section 1642 in a second direction opposite the first direction in which the distal section 1634 of the first dipole arm 1640 extends.

The proximal sections 1632 and 1642 of the first and second dipole arms 1630 and 1640 of the horizontally oriented dipole antenna elements 1620 may comprise parallel, overlapping striplines, and the distal sections 1634 and 1644 may be parallel striplines which do not have substantial overlap.

The vertically oriented dipole antenna elements 1670 may include an upper dipole arm 1680 including a proximal section 1682 and a distal section 1684 extending perpendicularly from the proximal section 1632 in an upward, vertical direction. The distal section may be defined by or include a via extending between the proximal section 1682 and may extend to an upper surface of the PCB 1610. The via may be a cylindrical via, and may in some embodiments be a solid cylindrical via or a hollow cylindrical via.

The vertically oriented dipole antenna elements 1670 also include a lower dipole arm 1690 including a proximal section 1692 and a distal section 1694 extending perpendicularly from the proximal section 1692 in an downward, vertical direction. The distal section may be defined by or include a via extending between the proximal section 1692 and may extend to a lower surface of the PCB 1610.

The proximal sections 1682 and 1692 of the upper and lower dipole arms 1680 and 1690 of the vertically oriented dipole antenna elements 1670 may comprise parallel, overlapping striplines, and the upper and lower distal sections 1684 and 1694 may be axially aligned cylindrical vias or axially aligned structures of another shape. The upper and lower distal sections 1684 and 1694 may in some embodiments be of unequal length, and the space between the upper and lower distal sections 1684 and 1694 may not be located at the exact midpoint between the upper and lower surfaces of the PCB 1610.

As can best be seen in FIG. 16B, the proximal section 1632 and distal section 1634 of the first horizontally oriented dipole antenna arm 1630 may be generally coplanar with the proximal section 1682 of the upper vertically oriented dipole antenna arm 1680. These proximal sections 1632 and 1682 may be connected to a ground plane (not shown), which may in some embodiments be coplanar with each of the proximal sections 1632 and 1682.

As can be seen in FIG. 16C, the proximal section 1642 of the second horizontally oriented dipole antenna arm 1640 and the proximal section 1692 of the lower vertically oriented dipole antenna arm 1690 may be connected to respective signal lines 1646 and 1696. In the illustrated embodiment, these signal lines 1646 and 1696 are coplanar with the proximal section 1642 of the second horizontally oriented dipole antenna arm 1640 and the proximal section 1692 of the lower vertically oriented dipole antenna arm 1690, although other configurations may also be used, as discussed in greater detail below.

As can be seen in FIG. 16D, the asymmetrical configuration of the sublayers of PCB 1610 illustrate that while the antenna elements may be integrated within the PCB, these antenna elements are not necessarily located in the exact middle of the PCB, but may instead be asymmetrically positioned within the PCB 1610.

In addition to the ground layer to which the proximal section 1642 of the second horizontally oriented dipole antenna arm 1640 and the proximal section 1692 of the lower vertically oriented dipole antenna arm 1690, the PCB 1610 may also include at least a second ground plane on the opposite side of these striplines as the first ground plane. Each of these ground planes, as well as any other horizontally extending ground planes, may be connected to the vertically extending vias 1608 which form the vertical ground-plane-like structure. The inclusion of the vertically extending vias 1608 can, for example, improve the front-to-back ratio of the antenna array.

Figure 17:
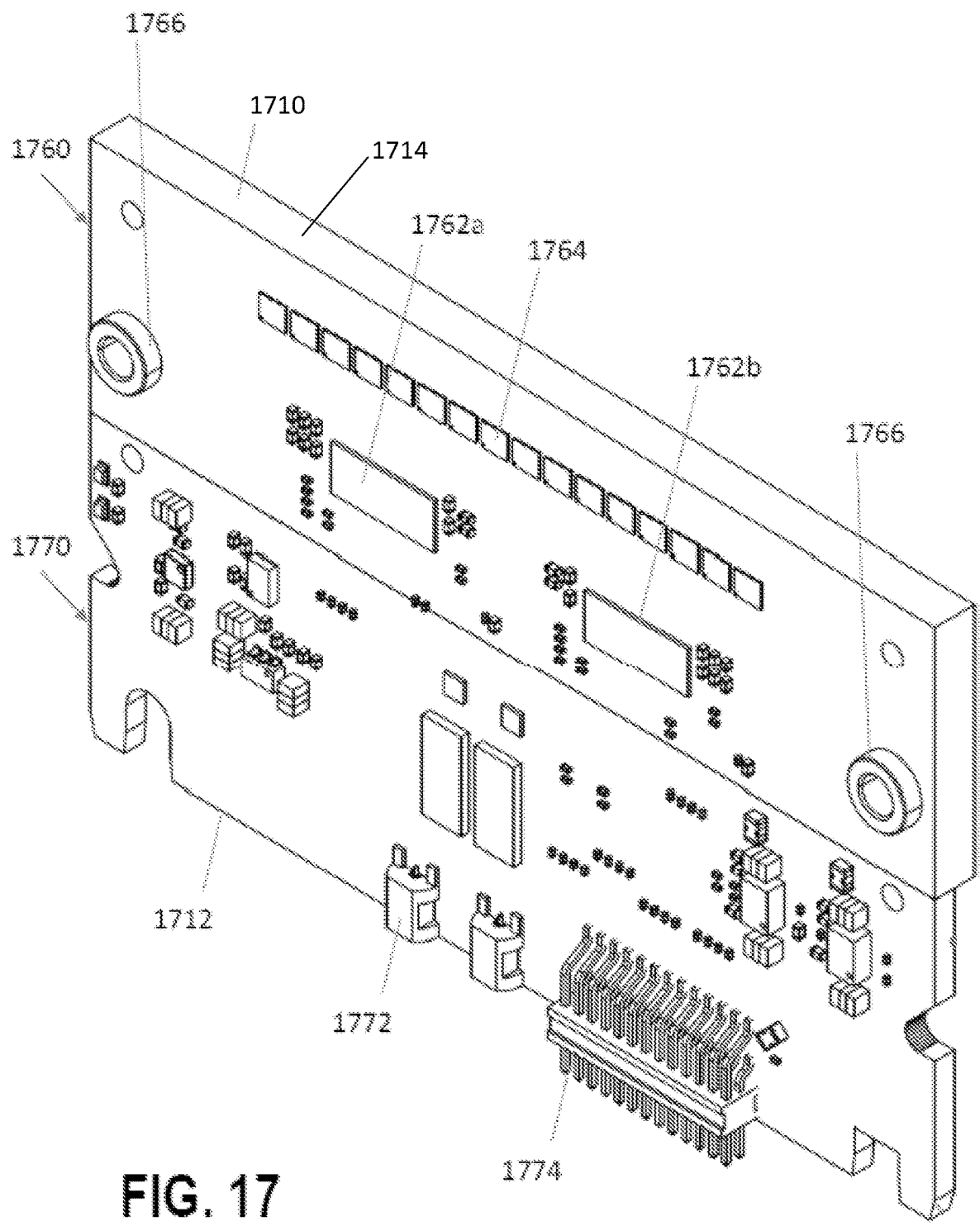
FIG. 17 is a perspective view illustrating another embodiment of a PCB having a plurality of components supported on a first side thereof.

FIG. 17 is a perspective view illustrating another embodiment of a PCB having a plurality of components supported on a first side thereof. Like the PCB 1210 of FIG. 12, the PCB 1710 includes a distal portion 1760 at the free end 1714 of the PCB 1710 which is thicker than a proximal portion 1770 closer to the fixed end 1712 at which the PCB 1710 will be supported by a backplane.

In addition to a plurality of alternating horizontally and vertically oriented dipole antenna elements embedded within the thicker distal portion 1760 of the PCB 1710 near the free end of the PCB 1710, the thicker distal portion 1760 also supports a number of additional components. In particular, a pair of beamforming integrated circuits 1762*a* and 1762*b* are located on the thicker distal portion 1760 of the PCB 1710.

Outward of the beamforming integrated circuits 1762*a* and 1762*b* and inward of the embedded dipole antenna elements near the free end 1714 of the PCB 1710 are a number of switches 1764, each of which is electrically connected between an embedded dipole element and one of the beamforming ICs 1762*a* and 1762*b*. These switches 1764 may be RF switches and can be used, for example, to operate the antenna array using time division duplexing.

Connections between the various components of the PCB may be made using a combination of vias and printed traces or other conductive structures. Striplines within the PCB 1710 may be phase-matched to assist with beamforming.

The PCB 1710 may also include spacers 1766 which can be used to maintain a desired spacing between adjacent PCBs to provide and maintain desired dimensions for the resulting antenna array. This connection using spacers 1766 may be purely mechanical, and may provide precise arrangement of the dipole elements in the overall antenna array without the need to also provide complex electrical connections from the PCB 1710 to an antenna array substrate.

In addition to the components supported by the thicker distal portion 1760 of the PCB 1710, the proximal portion 1770 also supports a plurality of components. In the illustrated embodiment, the proximal portion includes various components including connectors 1772 which can be used to electrically connect components of PCB 1710 to a backplane and other operational components of the antenna array supported to or connected via the backplane. In addition, one or more thermal dissipation structures 1774 are disposed on the thinner proximal portion 1770 of the PCB 1710.

The various components of the PCBs 1710, particularly the beamforming ICs 1762*a* and 1762*b*, can generate substantial amounts of heat during operation. Because the antenna array will include a plurality of PCBs 1710 in a parallel arrangement close to one another, and because the overall spacing between the PCBs 1710 is a function of the desired spacing between the antenna elements in adjacent PCBs 1710, the spacing between PCBs 1710 cannot be directly adjusted to increase thermal dissipation of this heat generated by the PCB components. However, by providing a PCB 1710 with a thicker portion and a thinner portion, additional spacing may be provided to improve the thermal management of the antenna array.

The thicker portion of the PCB can be dimensioned to accommodate the height of the vertically oriented dipole antenna element and any additional structures, and the thinner portion of the PCB 1710 can accommodate the height of the thermal dissipation structure 1774. This can allow the use of thermal dissipation structures 1774 having taller fins or similar heat-dissipation structures, as well as provide clearance between the thermal dissipation structure 1774 and an adjacent PCB, improving airflow and convective heat transfer.

In addition, in the illustrated embodiment, most or all of the components supported by the PCB are disposed on a single face of the PCB. In particular, the illustrated embodiment includes a single generally planar face extending the length of the PCB which supports all of the PCB components which extend substantially outward from the face of the PCB. The opposite side of the PCB includes two substantially planar surfaces, one on the back of the thicker portion and one on the back of the thinner portion. These substantially planar surface can also improve airflow along the PCB, improving conductive heat transfer away from the PCB.

In the PCB illustrated in FIG. 16C, the striplines connecting the dipole antenna elements to the signal are in the same plane as the printed components of the dipole antenna elements. In other embodiments, however, such as the embodiment of FIG. 17 in which the beamforming ICs and switches are located on the upper surface of the PCB, at least a portion of the signal lines connecting the beamforming ICs and switches to the embedded dipole antenna elements may be located at or near the upper surface of the PCB. Because the printed portions of the dipole antenna elements are located near the vertical midpoint of the PCB, one or more additional vias can be used to place the signal lines in electrical communication with the embedded dipole antenna elements.

Figure 18:
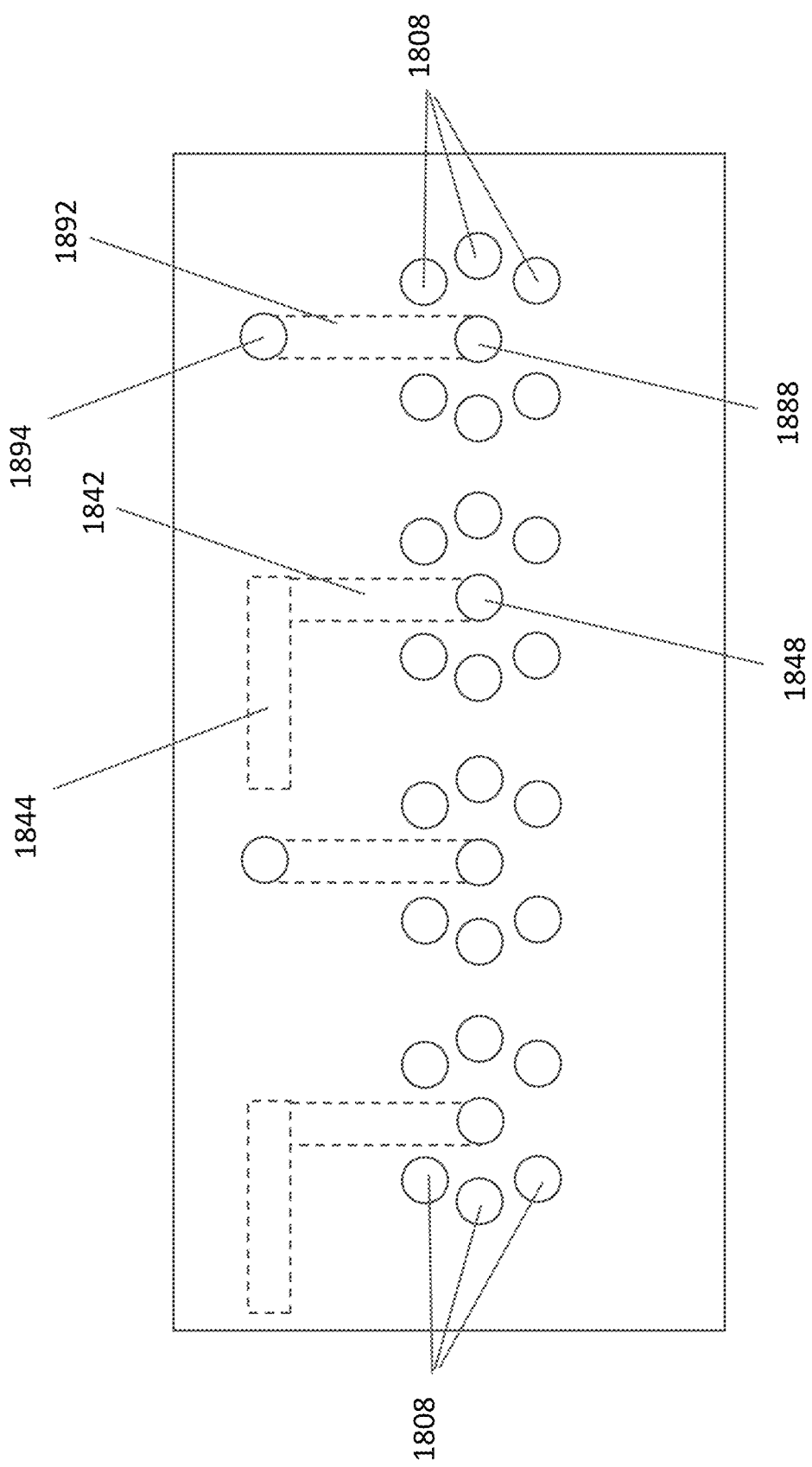
FIG. 18 is a top plan view schematically illustrating an alternative embodiment of a via arrangement in which a portion of the signal lines are not coplanar with the printed dipole components of the embedded dipole antenna elements.

FIG. 18 is a top plan view schematically illustrating an alternative embodiment of a via arrangement in which a portion of the signal lines are not coplanar with the printed dipole components of the embedded dipole antenna elements. In particular, FIG. 18 schematically illustrates certain via placement for four adjacent dipole antenna elements, two horizontally oriented, and two vertically oriented. A via 1888 can be used to provide a vertical connection with a proximal section 1892 of a lower arm of a vertically-oriented embedded dipole antenna element. The distal section 1894 of the lower arm of the vertically-oriented embedded dipole antenna element is placed in communication with the signal line using the via 1888.

Similarly, a via 1848 can be used to provide a vertical connection with a proximal section 1842 of a second arm of a horizontally-oriented embedded dipole antenna element. The distal section 1844 of the second arm of the horizontally-oriented embedded dipole antenna element is placed in communication with the signal line using the via 1848.

In some embodiments, the portions of the vertically-oriented embedded dipole antenna element and horizontally-oriented embedded dipole antenna element connected to ground planes may be connected in-plane, while in other embodiments, additional vias may also be used in the formation of these connections.

The via arrangement also includes a plurality of vertically extending vias 1808 surrounding each of the vias 1848 and 1888. These vertically extending vias 1808 may serve the same purpose as the vias 1708 of the PCB 1710 of FIG. 17A, connecting ground planes and functioning as a contiguous orthogonal ground plane to improve the front-to-back ratio of the antenna array. As can be seen in FIG. 18, these vias 1808 need not be aligned with one another, but can be located at various distances from the end of the PCB.

Figure 19:
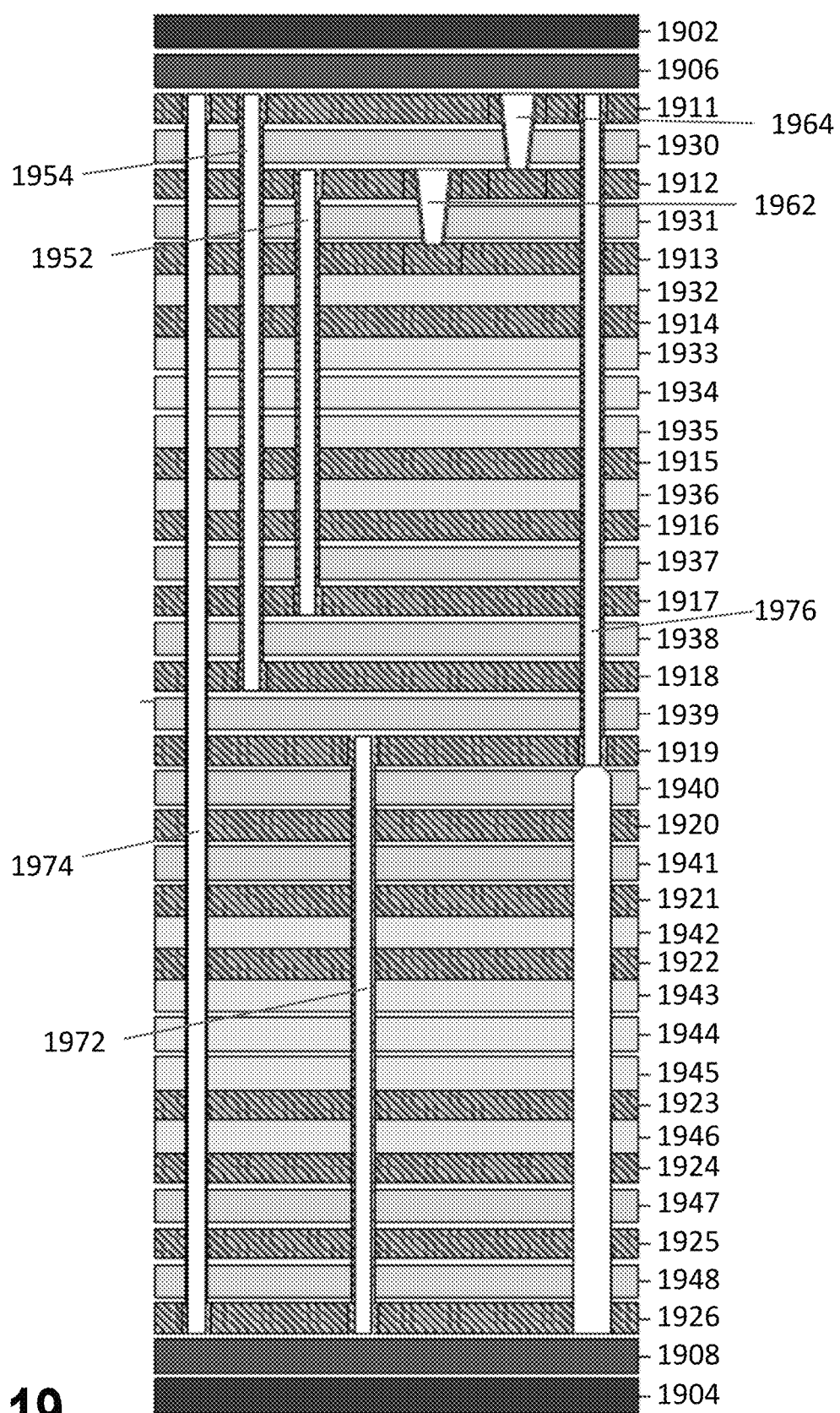
FIG. 19 is a cross-sectional view schematically illustrating an embodiment of a layer stack which can be used to fabricate a PCB such as the PCB of FIG. 17.

FIG. 19 is a cross-sectional view schematically illustrating an embodiment of a layer stack which can be used to fabricate a PCB such as the PCB 1710 of FIG. 17. The layer stack 1900 includes a top overlay 1902 over a top solder layer 1906, and a bottom overlay 1904 over a bottom solder layer 1908. Between these layers are conductive layers 1911 through 1928, each of which is spaced apart from one another by at least one of dielectric layers 1930 through 1948. Layers 1911 through 1918, and the intervening layers form the thin portion of the PCB, along with top overlay 1902 and top solder layer 1906, while all of the layers are present in the thick portion of the PCB.

Layer 1911 may be a top conductive layer, and layers 1912 and 1914 may be ground planes. Layer 1913 may be used for a combination of power and signal. Layer 1915 may also be used to provide power. Layer 1918 may be used for a combination of power and ground. Layers 1916 and 1917 may be used to provide a combination of ground and signal.

In some embodiments, layers 1912 through 1917 may be formed first, and patterned, drilled, etched, or otherwise modified to form through vias 1952 and vias 1962 connecting structures within layer 1912 to structures within layer 1913.

Layers 1911 and 1918 may then be formed on respective sides of the existing structure, and patterned, drilled, etched, or otherwise modified to form through vias 1954 and vias 1964 connecting structures within layer 1911 to structures within layer 1912. In some embodiments, the through vias 1954 may form the grounded vertical sections of embedded vertically oriented dipole antenna elements.

Layers 1919 through 1926 may be formed as a separate structure, and patterned, drilled, etched, or otherwise modified to form through vias 1972, which may form the signal-connected vertical sections of embedded vertically oriented dipole antenna elements.

Then, the two structures may be brought together, and patterned, drilled, etched, or otherwise modified to form through vias 1974 extending through all of the conductive layers and which may serve as the vias which function as an orthogonal ground plane, as well as through vias 1976 which may form be used to connect signal lines to the signal-connected portions of the embedded dipole antenna elements. This may include the use of a backdrill process.

In some embodiments, copper may be used as the conductive material, although in other embodiments, other suitable materials may also be used. Any suitable dielectric material may be used to form the dielectric layers, and the various dielectric layers may be formed from different dielectric materials in the same printed circuit board.

Figure 20A:
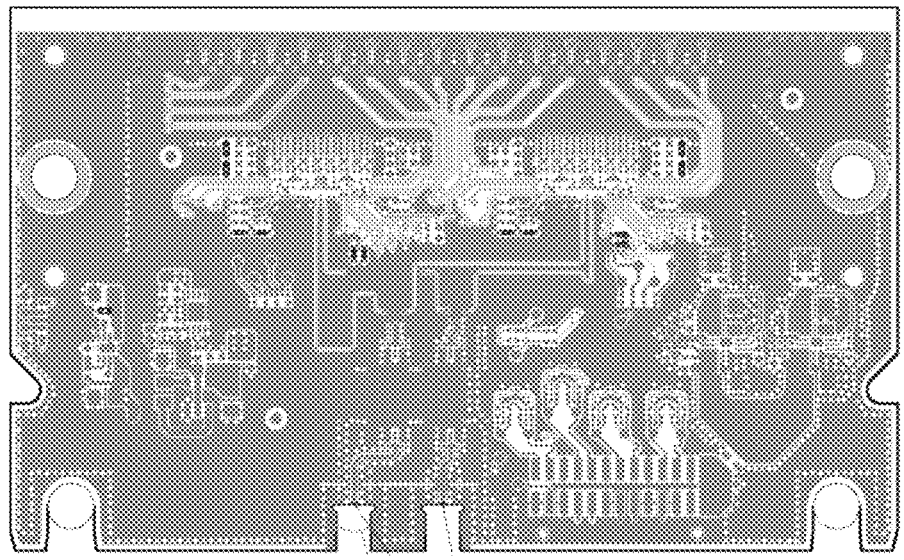
FIG. 20A is a top plan view of a PCB such as the PCB of FIG. 17, illustrating certain vias and conductive traces formed between various components.
Figure 20B:
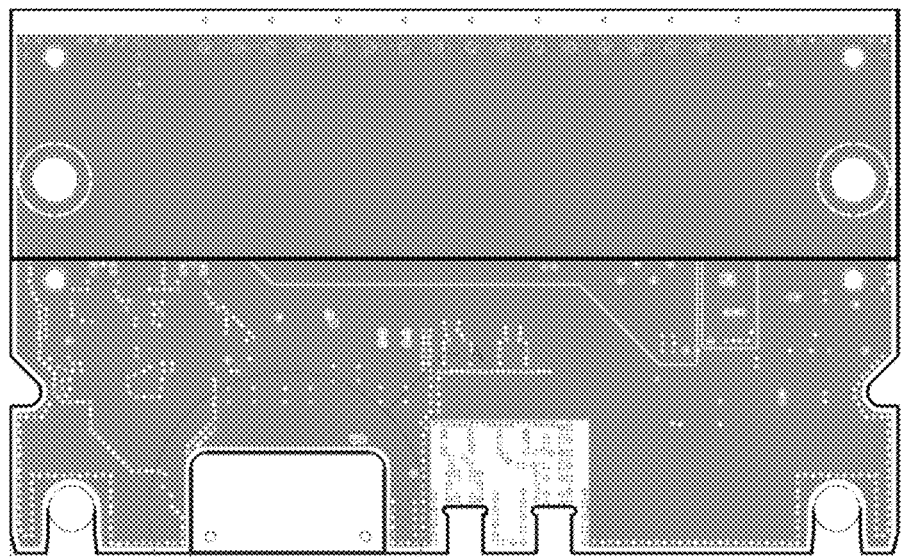
FIG. 20B is a bottom plan view of the PCB of FIG. 20A.

FIG. 20A is a top plan view of a PCB such as the PCB 1700 of FIG. 17, illustrating certain vias and conductive traces formed between various components. FIG. 20B is a bottom plan view of the PCB of FIG. 20A. As discussed above, it can be seen in the illustrated embodiment that the majority of the components supported by the PCB are supported on the top surface visible in FIG. 20A, and that the bottom generally planar surfaces visible in FIG. 20B are generally devoid of any structures supported thereon.

In the foregoing description, specific details are given to provide a thorough understanding of the examples. However, it will be understood by one of ordinary skill in the art that the examples may be practiced without these specific details. Certain embodiments that are described separately herein can be combined in a single embodiment, and the features described with reference to a given embodiment also can be implemented in multiple embodiments separately or in any suitable subcombination. In some examples, certain structures and techniques may be shown in greater detail than other structures or techniques to further explain the examples.

The previous description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein.

What is claimed is:

1. An antenna array comprising a plurality of printed circuit boards, the plurality of printed circuit boards configured to cooperate with one another to form a two-dimensional array of antenna elements, each of the plurality of printed circuit boards comprising:
   a first section proximate a first edge of the printed circuit board, the printed circuit board configured to be supported at the first edge of the printed circuit board by a backplane, the first section having a first thickness;
   a second section proximate a second edge of the printed circuit board, the second edge of the printed circuit board having a second thickness greater than the first thickness; and
   a thermal dissipation structure supported by the first section of the printed circuit board.

2. The antenna array of claim 1, wherein each of the printed circuit boards further comprises a linear array of dipole antenna elements embedded at least partially within the second section of the printed circuit board adjacent the second edge of the printed circuit board.

3. The antenna array of claim 2, wherein each of the printed circuit boards further comprises beamforming circuitry supported by the printed circuit board and in electrical communication with the linear array of dipole antenna elements.

4. The antenna array of claim 2, wherein the linear array of dipole antenna elements comprises a plurality of horizontally-oriented dipole antenna elements alternating with a plurality of vertically-oriented dipole antenna elements.

5. The antenna array of claim 4, wherein the plurality of vertically-oriented dipole antenna elements comprises a plurality of vertically-extending dipole vias, and wherein each of the printed circuit boards further comprises a plurality of vertically-extending ground vias, the plurality of vertically-extending dipole vias located closer to the second edge of the printed circuit board than the plurality of vertically-extending ground vias.

6. The antenna array of claim 1, wherein the plurality of printed circuit boards are arranged parallel to and spaced apart from one another, each of the plurality of printed circuit boards comprising a linear array of dipole antenna elements arranged along the second edge of the printed circuit board opposite the first edge of the printed circuit board, the linear arrays of dipole antenna elements on each of the plurality of printed circuit boards cooperating with one another to form the two-dimensional array of antenna elements.

7. The antenna array of claim 6, wherein each of the plurality of printed circuit boards are arranged orthogonal to the backplane.

8. The antenna array of claim 7, wherein each of the plurality of printed circuit boards supports a beamforming integrated circuit operably connected to at least a portion of the linear array of dipole antenna elements.

9. The antenna array of claim 8, wherein each of the plurality of printed circuit boards supports a second beamforming integrated circuit operably connected to at least a portion of the linear array of dipole antenna elements.

10. The antenna array of claim 8, wherein each of the plurality of printed circuit boards supports a plurality of switches, each of the plurality of switches arranged between the beamforming integrated circuit and a dipole antenna element of the linear array of dipole antenna elements.

11. The antenna array of claim 6, wherein the thermal dissipation structure comprises a plurality of fins.

12. The antenna array of claim 6, wherein the linear array of dipole antenna elements is at least partially embedded within the second section of the printed circuit board.

13. The antenna array of claim 6, wherein the linear array of dipole antenna elements includes a first subset of dipole antenna elements oriented in a first direction and a second subset of dipole antenna elements oriented in a second direction.

14. The antenna array of claim 13, wherein the first subset of dipole antenna elements are horizontally oriented and include a pair of parallel, non-coplanar sections, and wherein the second subset of dipole antenna elements are vertically oriented and include a pair of axially aligned vias spaced apart from one another.

15. The antenna array of claim 13, wherein the dipole antenna elements of the first subset of dipole antenna elements alternate with the dipole antenna elements of the second subset of dipole antenna elements along the length of the linear array of dipole antenna elements.

16. The antenna array of claim 1, wherein each of the plurality of printed circuit boards further comprises:
   a ground plane oriented substantially parallel to a major surface of the printed circuit board; and
   a plurality of conductive vias oriented orthogonally to the ground plane and connected to the ground plane.

17. The antenna array of claim 16, wherein the plurality of conductive vias are arranged in a pattern extending generally parallel to the second edge of the printed circuit board, and wherein a linear array of dipole elements are located between the plurality of conductive vias and the second edge of the printed circuit board.

* * * * *